United States Patent
Zou

(10) Patent No.: US 11,271,071 B2
(45) Date of Patent: Mar. 8, 2022

(54) INTEGRATED SYSTEM WITH POWER MANAGEMENT INTEGRATED CIRCUIT HAVING ON-CHIP THIN FILM INDUCTORS

(71) Applicant: NUVIA, INC., San Diego, CA (US)

(72) Inventor: Peng Zou, Portland, CA (US)

(73) Assignee: Nuvia, Inc., San Diego, CA (US)

( * ) Notice: Subject to any disclaimer, the term of this patent is extended or adjusted under 35 U.S.C. 154(b) by 0 days.

(21) Appl. No.: 17/096,824

(22) Filed: Nov. 12, 2020

(65) Prior Publication Data
US 2021/0151549 A1 May 20, 2021

Related U.S. Application Data

(60) Provisional application No. 62/936,333, filed on Nov. 15, 2019, provisional application No. 62/936,334, filed on Nov. 15, 2019.

(51) Int. Cl.
| | |
|---|---|
| *H01L 23/522* | (2006.01) |
| *H01L 25/065* | (2006.01) |
| *H01L 49/02* | (2006.01) |
| *H01L 23/528* | (2006.01) |
| *H01L 23/64* | (2006.01) |

(52) U.S. Cl.
CPC .......... *H01L 28/10* (2013.01); *H01L 23/5226* (2013.01); *H01L 23/5227* (2013.01); *H01L 23/5286* (2013.01); *H01L 23/645* (2013.01); *H01L 25/0657* (2013.01)

(58) Field of Classification Search
CPC ...................................................... H01L 28/10
USPC ...................... 257/531, 532; 438/3, 107, 396
See application file for complete search history.

(56) References Cited

U.S. PATENT DOCUMENTS

2018/0110123 A1* 4/2018 Sturcken et al. ...... H05K 1/181

* cited by examiner

*Primary Examiner* — Thinh T Nguyen
(74) *Attorney, Agent, or Firm* — Morgan, Lewis & Bockius LLP (PA)

(57) ABSTRACT

A semiconductor device includes a substrate having a surface and a thin film inductor formed on top of the surface of the substrate and having a conductive wire, a first stack of magnetic layers and a second stack of magnetic layers. The conductive wire is disposed between the first and second stacks of magnetic layers, and the thin film inductor is configured to provide a magnetic field in the first and second stacks of magnetic layers in response to a current passing through the conductive wire. The first stack of magnetic layers has a first edge portion extending in parallel with a longitudinal axis of the conductive wire, and the second stack of magnetic layers has a second edge portion that covers the first edge portion conformally and is separated from the first edge portion by an insulation layer.

20 Claims, 12 Drawing Sheets

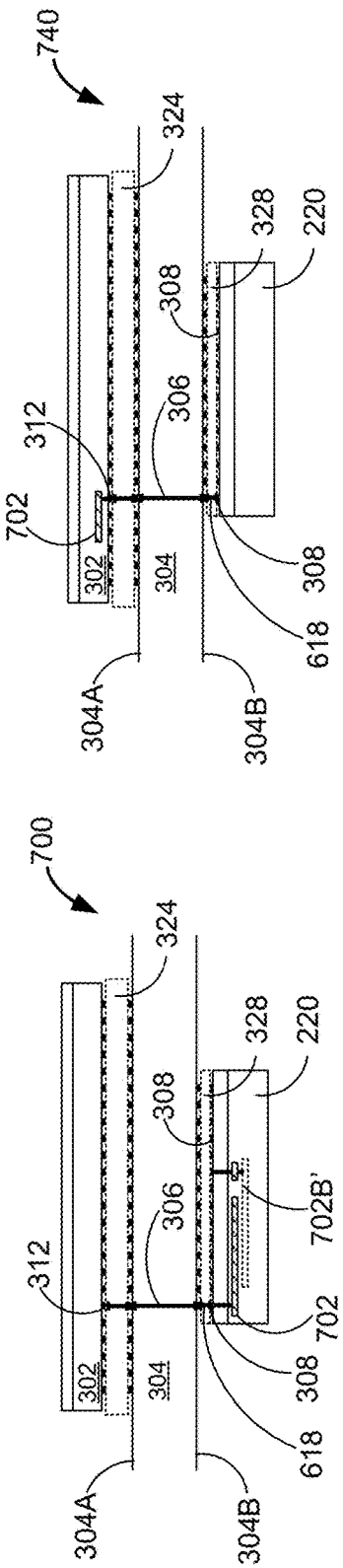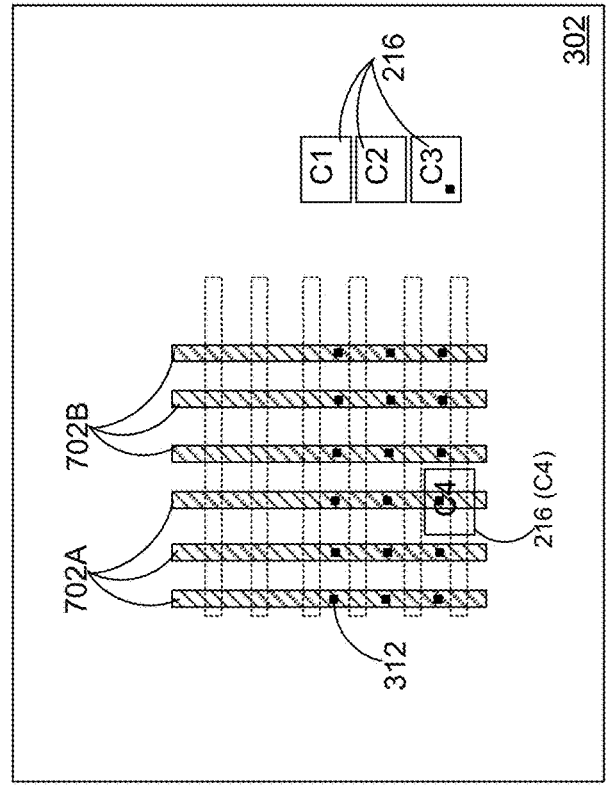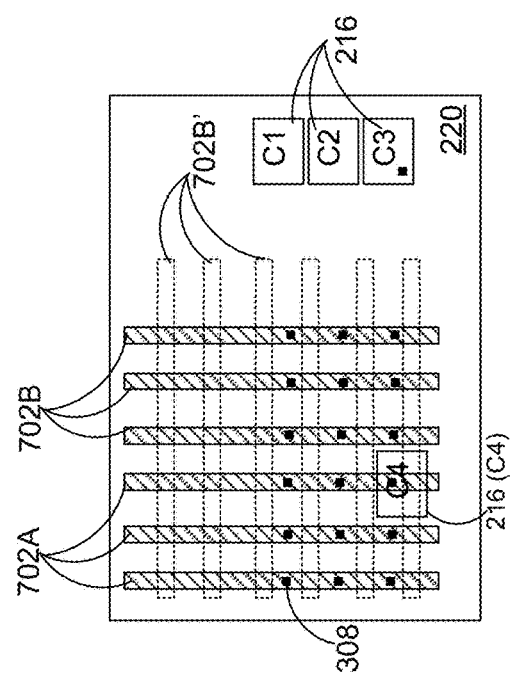
Figure 7A
Figure 7B
Figure 7C
Figure 7D

INTEGRATED SYSTEM WITH POWER MANAGEMENT INTEGRATED CIRCUIT HAVING ON-CHIP THIN FILM INDUCTORS

RELATED APPLICATIONS

This application claims priority to U.S. Provisional Application No. 62/936,333, filed Nov. 15, 2019, titled "Integrated System with Power Management Integrated Circuit Having On-Chip Thin Film Inductors" and U.S. Provisional Application No. 62/936,334, filed Nov. 15, 2019, titled "Vertically Integrated Device Stack Including System on Chip and Power Management Integrated Circuit," each of which is incorporated by reference in its entirety.

This application is related to U.S. patent application Ser. No. 17/096,828, filed Nov. 12, 2020, titled "Vertically Integrated Device Stack Including System on Chip and Power Management Integrated Circuit," which is incorporated by reference in its entirety.

BACKGROUND

An electronic device oftentimes relies on a main logic board to connect a system on a chip (SoC) to a power management integrated circuit (PMIC), communication ports, external memory or storage, and other peripheral function modules. The SoC is implemented on an integrated circuit that integrates a microprocessor or central processing unit, memory, input/output ports and secondary storage on a single substrate. The PMIC is typically disposed adjacent to the SoC on the main logic board. The PMIC is physically and electrically coupled to the SoC via conductive wires formed in the main logic board to provide the SoC with direct current (DC) supply voltages via the conductive wires. However, as the conductive wires are routed on the main logic board, both parasitic effects (e.g., resistance, inductance and capacitance) and electrical noise are introduced at nodes connected to the DC supply voltages delivered by the conductive wires of the main logic board, thereby compromising performance of the SoC (e.g., voltage drop at a voltage supply, signal-to-noise ratio, speed of internal signals). As such, it would be highly desirable to provide a semiconductor device or system that reduces or suppresses parasitic effects and electrical noise coupled into the DC supply voltages provided to the SoC by the PMIC.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to provide a semiconductor device that integrates a system-on-chip (SoC) die and a power management integrated circuit (PMIC) die in a stack where the SoC die and the PMIC die are disposed adjacent to and on top of each other to reduce parasitic effects and electrical noise on the conductive wires that couple internal supply voltages provided by the PMIC die to the SoC die.

In one aspect, an integrated semiconductor device includes at least the PMIC die, the SoC die, and a package substrate on which the PMIC die and the SoC die are mounted. The package substrate has a first surface, a second surface and a plurality of first via interconnects, and is configured to be electrically coupled to a socket substrate via a plurality of electrical connectors. The socket substrate has a third surface configured to face the second surface of the package substrate. The SoC die is disposed on the first surface of the package substrate, and the PMIC die is mechanically coupled to the second surface of the package substrate. The PMIC die is electrically coupled to the SOC die via the plurality of first via interconnects of the package substrate, and is configured to provide DC power to the SOC die via a plurality of DC connections electrically coupled to the via interconnects of the package substrate. The PMIC die includes a plurality of thin film inductors corresponding to the plurality of DC connections, and the plurality of thin film inductors is located adjacent to or facing the second surface of the package substrate, e.g., between a top surface of the PMIC die and the second surface of the package substrate.

Further, in another aspect of the invention, a semiconductor device includes a substrate having a surface and a thin film inductor that is formed on top of the surface of the substrate and has a conductive wire, a first stack of magnetic layers and a second stack of magnetic layers. The conductive wire is disposed between the first and second stacks of magnetic layers, and the thin film inductor is configured to provide a magnetic field in the first and second stacks of magnetic layers in response to a current passing through the conductive wire. The first stack of magnetic layers has a first edge portion extending in parallel with a longitudinal axis of the conductive wire, and the first edge portion has a first thickness that gradually decreases with distance from the conductive wire. The second stack of magnetic layers has a second edge portion that covers the first edge portion conformally and is separated from the first edge portion by an insulation layer, the insulation layer having a thickness less than a separation threshold corresponding to a magnetic flux coupling criterion.

Other embodiments and advantages may be apparent to those skilled in the art in light of the descriptions and drawings in this specification.

BRIEF DESCRIPTION OF THE DRAWINGS

FIG. 7A is a cross sectional view of a portion of an integrated semiconductor device including a plurality of power rails and a plurality of output capacitors, in accordance with some embodiments, and FIG. 7B is a top view of a corresponding PMIC die that includes power rails and output capacitors, in accordance with some embodiments.

FIG. 7C is a cross sectional view of a portion of another example integrated semiconductor device 300 including a plurality of power rails and a plurality of output capacitors, in accordance with some embodiments, and FIG. 7D is a top view of a corresponding SoC die having power rails and output capacitors, in accordance with some embodiments.

Like reference numerals refer to corresponding parts throughout the drawings.

DESCRIPTION OF EMBODIMENTS

Figure 1:
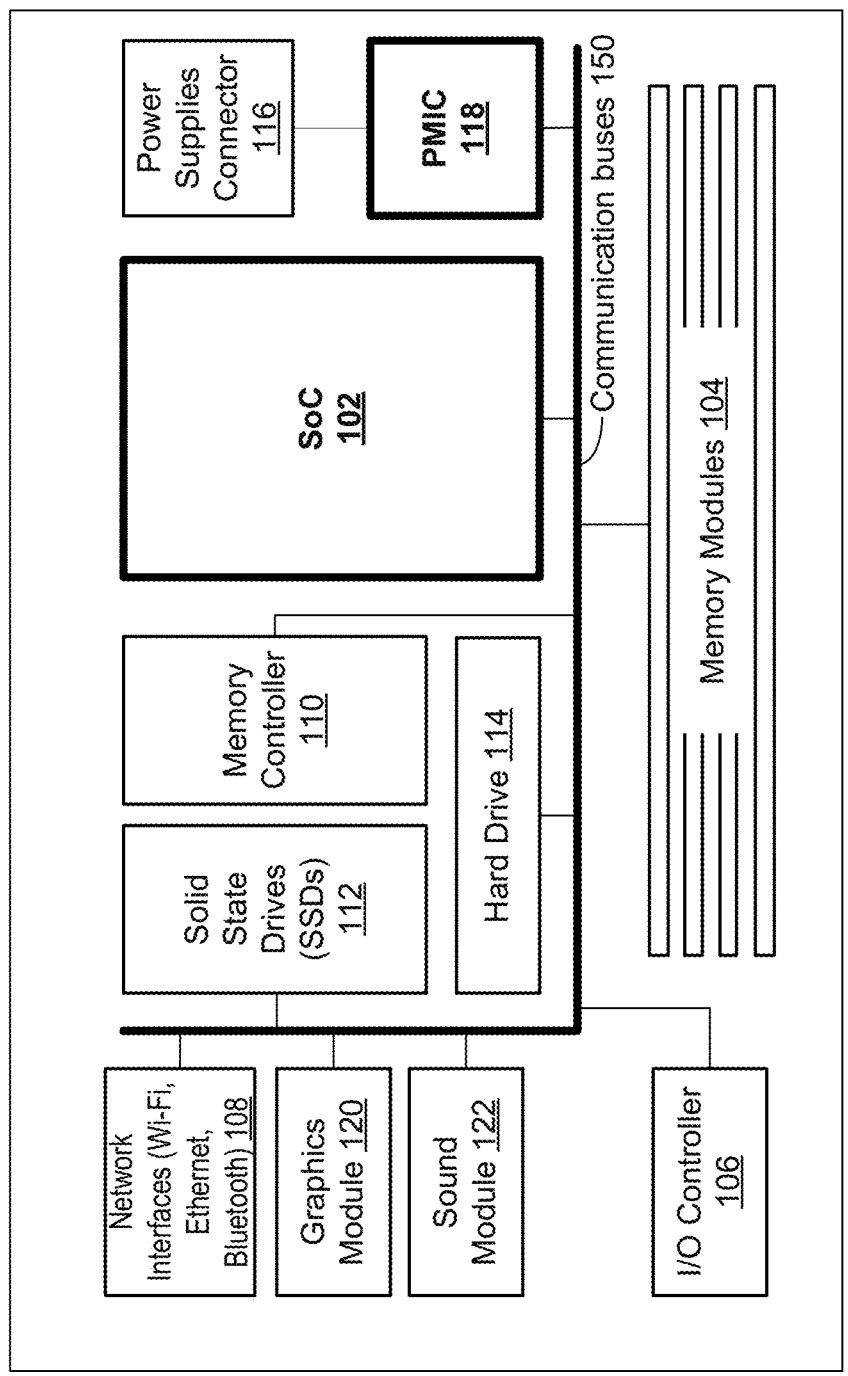
FIG. 1 is a block diagram of an example system module.

FIG. 1 is a block diagram of an example system module 100 in a typical electronic device in accordance with some embodiments. System module 100 in this electronic device includes at least a system on a chip (SoC) 102, memory modules 104 for storing programs, instructions and data, an input/output (I/O) controller 106, one or more communication interfaces such as network interfaces 108, and one or more communication buses 150 for interconnecting these components. In some embodiments, I/O controller 106 allows SoC 102 to communicate with an I/O device (e.g., a keyboard, a mouse or a track-pad) via a universal serial bus interface. In some embodiments, network interfaces 108 includes one or more interfaces for Wi-Fi, Ethernet and Bluetooth networks, each allowing the electronic device to exchange data with an external source, e.g., a server or another electronic device. In some embodiments, communication buses 150 include circuitry (sometimes called a chipset) that interconnects and controls communications among various system components included in system module 100.

In some embodiments, memory modules 104 include high-speed random access memory, such as DRAM, SRAM, DDR RAM or other random access solid state memory devices. In some embodiments, memory modules 104 include non-volatile memory, such as one or more magnetic disk storage devices, optical disk storage devices, flash memory devices, or other non-volatile solid state storage devices. In some embodiments, memory modules 104, or alternatively the non-volatile memory device(s) within memory modules 104, include a non-transitory computer readable storage medium. In some embodiments, memory slots are reserved on system module 100 for receiving memory modules 104. Once inserted into the memory slots, memory modules 104 are integrated into system module 100.

In some embodiments, system module 100 further includes one or more components selected from:
- a memory controller 110 that controls communication between SoC 102 and memory components, including memory modules 104, in electronic device;
- solid state drives (SSDs) 112 that apply integrated circuit assemblies to store data in the electronic device, and in many embodiments, are based on NAND or NOR memory configurations;
- a hard drive 114 that is a conventional data storage device used for storing and retrieving digital information based on electromechanical magnetic disks;
- a power supply connector 116 that is electrically coupled to receive an external power supply;
- power management integrated circuit (PMIC) 118 that modulates the received external power supply to other desired DC voltage levels, e.g., 5V, 3.3V or 1.8V, as required by various components or circuits (e.g., SoC 102) within electronic device 100;
- a graphics module 120 that generates a feed of output images to one or more display devices according to their desirable image/video formats; and
- a sound module 122 that facilitates the input and output of audio signals to and from the electronic device under control of computer programs.

It is noted that communication buses 150 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

In some embodiments, SoC 102 is implemented on an integrated circuit that integrates a microprocessor or central processing unit, memory, input/output ports and secondary storage on a single substrate. SoC 102 is configured to receive one or more internal supply voltages provided by PMIC 118. In some embodiments, both SoC 102 and PMIC 118 are mounted on a main logic board, e.g., on two distinct areas of the main logic board, and electrically coupled to each other via conductive wires formed in the main logic board. As explained above, this arrangement introduces parasitic effects and electrical noise that could compromise performance of the SoC, e.g., cause a voltage drop at an internal voltage supply. Alternatively, in accordance with various embodiments described below, SoC 102 and PMIC 118 are vertically arranged in an integrated semiconductor device, such that they are electrically coupled to each other via electrical connections that are not formed in the main logic board. Such vertical arrangement of SoC 102 and PMIC 118 can reduce a length of electrical connections between SoC 102 and PMIC 118 and avoid performance degradation caused by the conductive wires of the main logic board.

It is noted that, in some embodiments, vertical arrangement of SoC 102 and PMIC 118 is facilitated in part by integration of thin film inductors in a limited space between SoC 102 and PMIC 118. For example, in some embodiments the limited space has a height that is less than 1.5 mm (millimeter), and typically has a height of 0.5 to 1.5 mm. Specifically, the thin film inductors are formed and integrated on a substrate of PMIC 118 and have an inductor height that is controlled to be less than the height of the limited space, such that the thin film inductors can fit into the limited space between SoC 102 and PMIC 118. As the thin film inductors are formed on top of PMIC 118, the thin film inductors can be directly connected to internal nodes or output nodes of PMIC 118, and no conductive wires of the main logic board are used to connect the thin film inductors to the internal or output nodes of PMIC 118.

Figure 2:
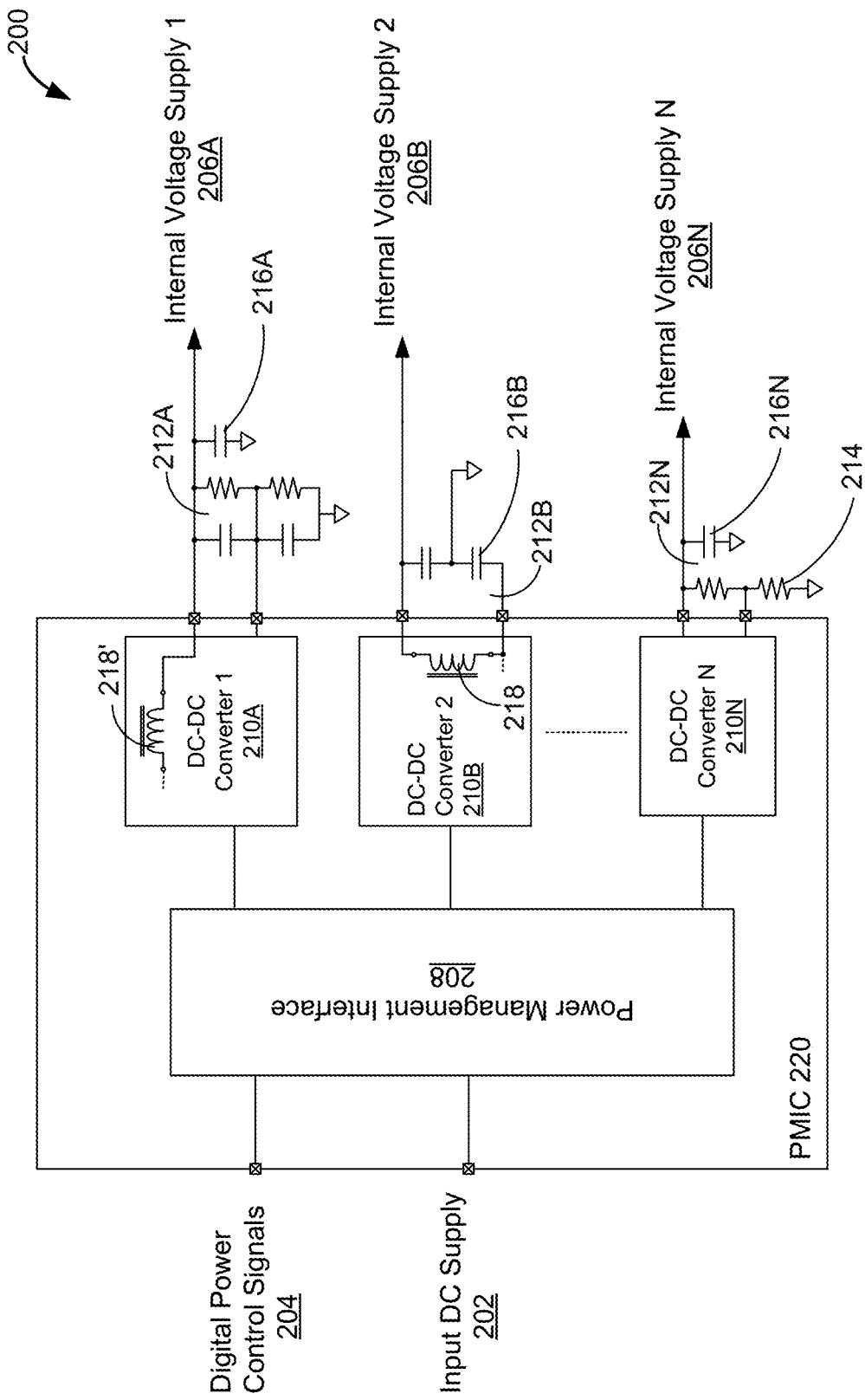
FIG. 2 is a block diagram of a power management system in accordance with some embodiments.

FIG. 2 is a block diagram of a power management system 200 configured to provide one or more internal supply voltages to a SoC, such as SoC 102, in accordance with some embodiments. Power management system 200 receives an input DC voltage supply 202 and digital power control signals 204, and converts the input DC voltage (from input DC voltage supply 202) to the one or more internal supply voltages, (e.g., output by one or more internal voltage supplies 206A, 206B to 206N) provided to SoC 102. Power management system 200 includes a power management interface 208, one or more DC-DC converters 210 (e.g., DC-DC converters 210A, 210B . . . 210N), and one or more output filters 212. Power management interface 208 receives the input DC voltage supply 202 and digital power control signals 204. In some embodiments, power management interface 208 is controlled by a master power management interface of a central processor unit (e.g., SoC 102) and configured to receive digital power control signals 204 from SoC 102. DC-DC converters 210 are coupled to power management interface 208 and internal voltage supplies 206, and are controlled by the digital power control signals 204 to generate the one or more internal supply voltages (provide on internal voltage supplies 206) from the input DC voltage supply 202. Output filters 212 are coupled to DC-DC converters 210 and configured to reduce noise in and maintain stability of internal voltage supplies 206 provided to SoC 102. In some embodiments, an output filter (e.g., any of 212A, 212B, . . . 212N) includes one or more respective output resistors 214 and one or more output capacitors 216 (e.g., 216A, 216B, . . . 216N). In some embodiments, an output filter (e.g., 212B) includes an inductor 218 and one or more output capacitors (e.g., capacitor 216B).

In some embodiments, power management system 200 is implemented on a PMIC die 220 (corresponding to PMIC 118 of FIG. 1) having a single substrate. In some embodiments, power management interface 208 and DC-DC converters 210 are formed on a substrate of PMIC die 220, i.e., belong to the same integrated circuit fabricated on the substrate of PMIC die 220. In some embodiments, in addition to power management interface 208 and DC-DC converters 210, PMIC die 220 further includes a plurality of thin film inductors that are fabricated or mounted on a top surface of the substrate of PMIC die 220. Optionally, the plurality of thin film inductors include one or more inductors 218 used in output filters 212. Optionally, the plurality of thin film inductors includes one or more inductors 218' used in DC-DC converters 210. In some embodiments, in addition to interface 208, converters 210 and inductors 218/218', PMIC die 220 further integrates a subset of output resistors 214 and capacitors 216 of output filters 212.

In some embodiments, power management system 200 is configured to drive SoC 102. A corresponding SoC die is mechanically and electrically coupled to PMIC die 220, and configured to be driven by the one or more internal voltage supplies 206 provided by the power management system 200.

Further, in some embodiments, the SoC die 102 is configured to be driven by a plurality of power management systems 200, each of which is associated with a respective PMIC die 220. In such embodiments, a SoC die is mechanically and/or electrically coupled to a plurality of PMIC dies 220, and configured to be driven by more than one set of internal voltage supplies 206, each set of which is provided by a respective power management system 200.

Figure 3A:
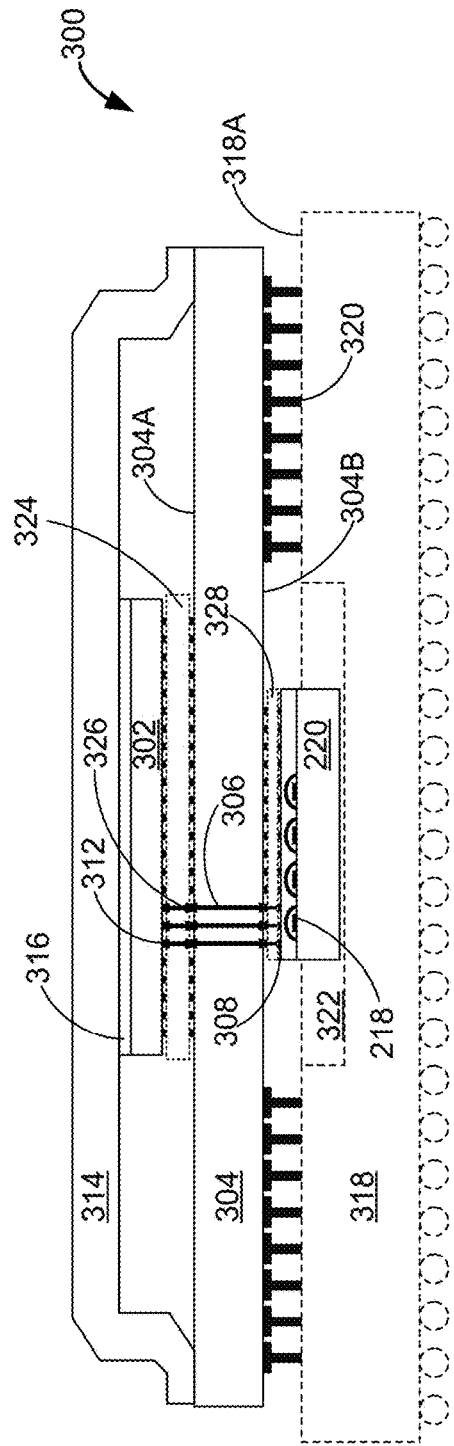
FIGS. 3A, 3B, and 3C are cross sectional views of three integrated semiconductor devices, in accordance with some embodiments.
Figure 3B:
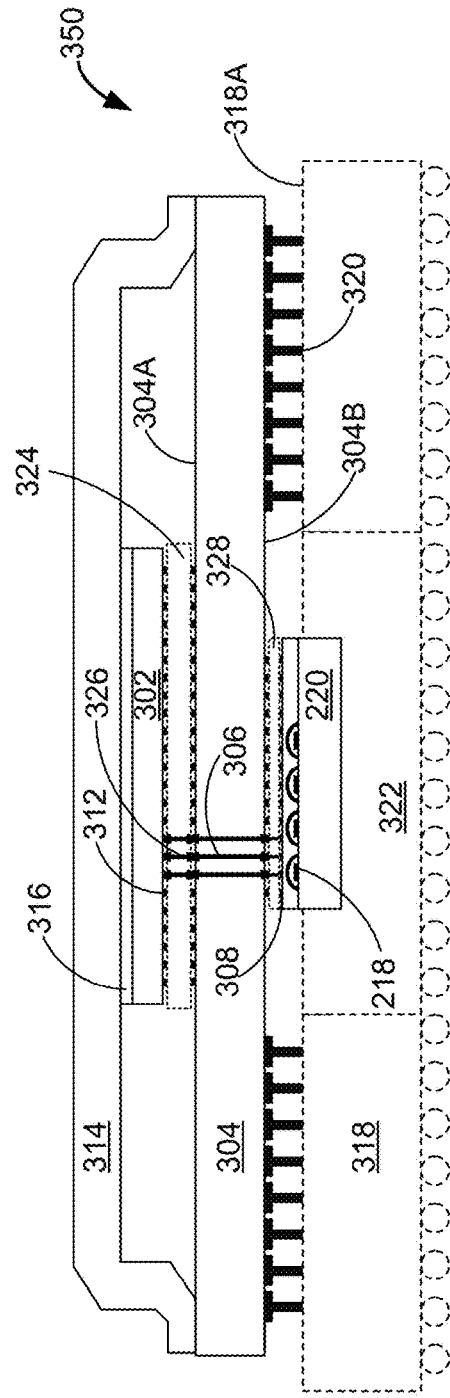
Figure 3C:
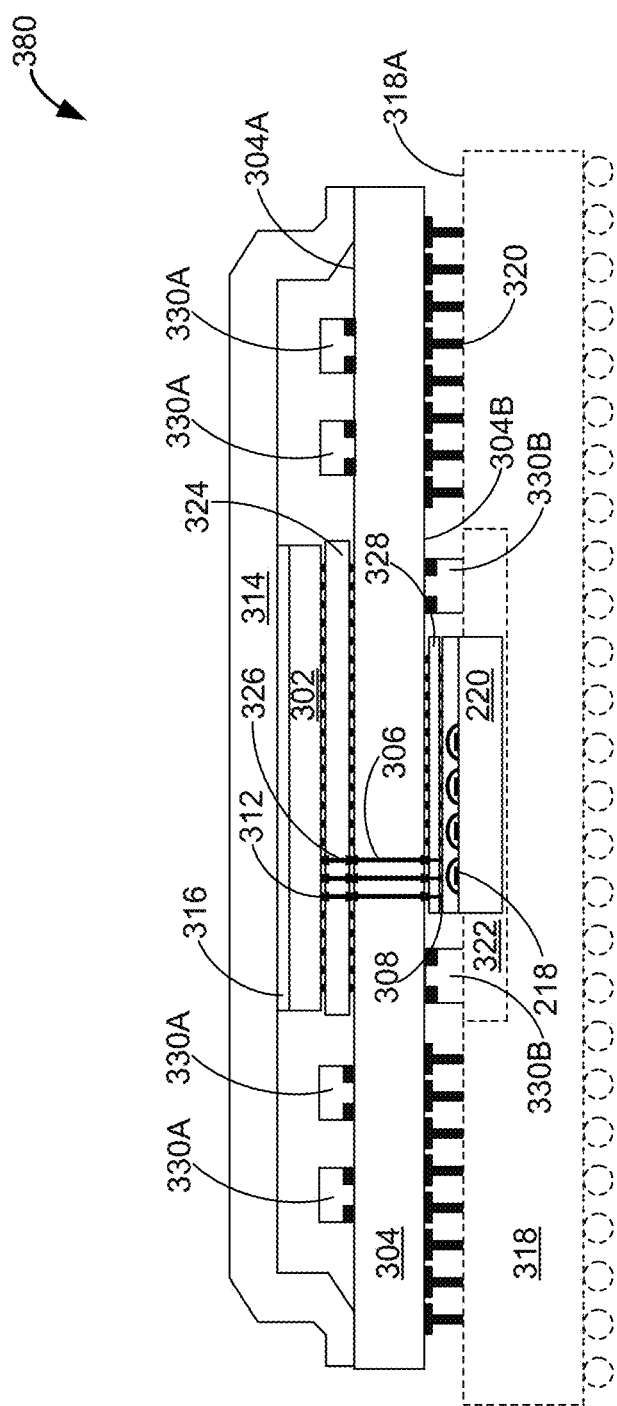

FIGS. 3A, 3B, and 3C are cross sectional views of three example integrated semiconductor devices 300, 350, and 380 in accordance with some embodiments. Each of integrated semiconductor devices 300, 350 and 380 integrates a SoC die 302 and a PMIC die 220. Referring to FIG. 3A, integrated semiconductor device 300 includes at least a package substrate 304 having a first surface 304A and a second surface 304B that is opposite to first surface 304A. SoC die 302 is disposed on first surface 304A of package substrate 304, and PMIC die 220 is mechanically coupled to second surface 304B of package substrate 304.

Package substrate 304 further includes a plurality of first via interconnects 306 that pass through a body of package substrate 304 and is exposed on both first and second surfaces 304A and 304B. PMIC die 220 is electrically coupled to SoC die 302 via the plurality of first via interconnects 306 of package substrate 304. Specifically, PMIC die 220 includes a plurality of DC connections 308 configured to output a plurality of internal supply voltages, provided by internal voltage supplies 206 (FIG. 2). When PMIC die 220 is mounted on second surface 304B of package substrate 304, DC connections 308 are electrically coupled to the plurality of first via interconnects 306 of package substrate 304. In some embodiments, SoC die 302 includes a plurality of power connections 312 configured to receive the plurality of internal supply voltages. When SoC die 302 is mounted on first surface 304A of package substrate 304, power connections 312 are electrically coupled to the plurality of first via interconnects 306 of package substrate 304. As such, PMIC die 220 is configured to provide DC power to SoC die 302 via DC connections 308 of PMIC die 220, power connections 312 of SoC die 302, and first via interconnects 306 of package substrate 304. Further, by using very low impedance DC connections 308, the quality of the DC power provided PMIC die 220 to SoC die 302 is substantially improved relative to systems in which PMIC die 220 and SoC die 302 are positioned side by side on a main circuit board.

In some embodiments, power management interface 208 is controlled by a master power management interface of SoC die 302, and configured to receive digital power control signals 204 from SoC die 302. A subset of first via interconnects 306 is configured to transfer digital power control signals 204 from SoC die 302 to PMIC die 220.

SoC die 302 has a first footprint (e.g., 504 in FIG. 5B) on package substrate 304, and PMIC 220 has a second footprint (e.g., 506 in FIG. 5B) on package substrate 304. The first and second footprints at least partially overlap for the purposes of coupling DC connections 308 of PMIC die 220 and power connections 312 of SoC die 302 directly using the plurality of first via interconnects 306. In some situations, the first footprint of SoC die 302 is larger than and entirely encloses the second footprint of PMIC die 220. Alternatively, in some situations, the first footprint of SoC die 302 is offset from the second footprint of PMIC die 220, but at least partially overlaps the second footprint of PMIC die 220.

Additionally, PMIC die 220 includes a plurality of thin film inductors 218 corresponding to the plurality of DC connections 308. The plurality of thin film inductors 218 is located adjacent to or facing second surface 304B of package substrate 304, e.g., on a top surface of PMIC die 220 facing second surface 304B of package substrate 304. Stated another way, the plurality of thin film inductors 218 is disposed between the top surface of PMIC die 220 and second surface 304B of package substrate 304. In some embodiments, PMIC die 220 is mechanically coupled to package substrate 304, e.g., via an adhesive. A height of the plurality of thin film inductors 218 is less than a predetermined threshold height (e.g., 1 mm, 100 µm) to maintain robustness of mechanical coupling between PMIC die 220 and package substrate 304.

In some embodiments, integrated semiconductor device 300 further includes a cover 314 coupled to first surface 304A of package substrate 304. Cover 314 is configured to conceal SoC die 302 and at least part of first surface 304A of package substrate 304, thereby protecting SoC die 302 and at least part of first surface 304A. Further, in some embodiments, cover 314 is made of an electrically conductive material and configured to be grounded to provide electrostatic shielding for SoC die 302 and any other circuit on first surface 304A, if completed concealed by cover 314, or the part of first surface 304A concealed by cover 314 if first surface 304A is only partially concealed by cover 314. In some situations, cover 314 is made of a thermally conductive material configured to dissipate heat generated by SoC die 302. In some embodiments, a thermal spreader 316, or layer of thermal spreader, is used to couple SoC die to an interior surface of cover 314 to spread the heat generated by SoC die 302 evenly from SoC die 302 to cover 314.

In some embodiments, integrated semiconductor device 300 further includes a socket substrate 318. Socket substrate 318 has a third surface 318A facing second surface 304B of package substrate 304. Package substrate 304 is electrically coupled to socket substrate 318 via a plurality of electrical connectors 320. Specifically, second surface 304B of package substrate 304 includes a first area (e.g., a central area) to which PMIC die 220 is mechanically coupled and a second area (e.g., a peripheral area) where the plurality of electrical connectors 320 are located. In an example (e.g., in FIGS. 5B and 5C), the second area is adjacent to and surrounds the first area.

In some embodiments, third surface 318A of socket substrate 318 is substantially flat, and PMIC die 220 is disposed between second surface 304B of package substrate 304 and third surface 318A of socket substrate 318. A height of the plurality of thin film inductors 218 is less than a predetermined threshold height (e.g., 1 mm, 100 µm) that is determined by a length of electrical connectors 320 and a thickness of PMIC die 220. Alternatively, in some embodiments, socket substrate 318 includes a recessed portion 322 that is formed on third surface 318A and configured to receive PMIC die 220 when PMIC die 220 is mechanically and electrically coupled to second surface 304B of package substrate 304. A depth of recessed portion 322 is less than a thickness of socket substrate 318. In some situations, PMIC die 220 is suspended in recessed portion 322, i.e., separated from a bottom surface of recessed portion 322 by an air gap. Alternatively, in some situations, PMIC die 220 comes into contact with the bottom surface of recessed portion 322 directly or via an intermediate layer (e.g., an adhesive layer, a thermal spreader layer, or a layer that is both adhesive and a thermal spreader).

Referring to FIG. 3B, in some embodiments, the depth of recessed portion 322 is equal to the thickness of socket substrate 318, and recessed portion 322 is an opening or cutoff on socket substrate 318. When socket substrate 318 is mounted on a circuit board, PMIC die 220 is suspended in recessed portion 322 (also called opening or cutoff), and at least partially surrounded by package substrate, socket substrate 318, and the circuit board.

It is noted that under some circumstances, integrated semiconductor device 300 or 350 is provided with socket substrate 318. However, under some circumstances, socket substrate 318 is fixed on the circuit board of the electronic device 100, and is not part of integrated semiconductor device 300 or 350. Rather, integrated semiconductor device 300 or 350 is a replaceable part that is provided to offer functions of a combination of PMIC die 220 and SoC die 302.

Referring to FIG. 3A, in some embodiments, power connections 312 of SoC die 302 are not coupled to first via interconnects 306 of package substrate 304 directly. Rather, a first interposer 324 is disposed between SoC die 302 and first surface 304A of package substrate 304. First interposer 324 further includes a plurality of second via interconnects 326 configured to at least electrically couple power connections 312 of SoC die 302 and first via interconnects 306 of package substrate 304. Likewise, in some embodiments, DC connections 308 of PMIC die 220 are not coupled to first via interconnects 306 of package substrate 304 directly. Rather, a second interposer 328 is disposed between PMIC die 220 and second surface 304B of package substrate 304. Second interposer 328 further includes a plurality of third via interconnects (i.e., 618 in FIG. 6) configured to at least electrically couple DC connections 308 of PMIC die 220 and first via interconnects 306 of package substrate 304. More details on first interposer 324 and second interposer 328 are discussed below with reference to FIGS. 6 and 7A-7F.

Referring to FIG. 3C, in some embodiments, integrated semiconductor device 380 further includes one or more discrete electronic components 330 (e.g., resistor, capacitor, inductor, transistors, and logic chip). Discrete electronic components 330 may be electrically coupled in an input/output interface circuit of SoC die 302 to control input/output coupling for SoC die 302. Optionally, a subset of discrete electronic components 330 (e.g., components 330A) is disposed on first surface 304A of package substrate 304. Each component 330A may be contained within cover 314 or located outside cover 314. Optionally, a subset of discrete electronic components 330 (e.g., components 330B) is mechanically coupled to second surface 304B of package substrate 304. If a respective component 330B has a low profile (e.g., thinner than a length of electrical connectors 320), component 330B may fit into a gap between second surface 304B of package substrate 304 and third surface 318A of socket substrate 318. Otherwise, if component 330B does not have a low profile (e.g., thicker than the length of electrical connectors 320), a respective component 330B can be received by recessed portion 322 of socket substrate 318 and disposed adjacent to PMIC die 220.

In various embodiments, SoC die 302 and PMIC die 220 are vertically arranged in each of integrated semiconductor devices 300, 350 and 380. Power connections 312 of SoC die 302 and DC connections 308 of PMIC die 220 are aligned and positioned in proximity to each other, thereby reducing parasitic resistance and capacitance coupled to each internal voltage supply 206 that provides an internal supply voltage to SoC die 302. As such, this vertical arrangement of SoC die 302 and PMIC die 220 can reduce or eliminate performance issues that exist when SoC die 302 and PMIC die 220 are electrically coupled by conductive wires of a circuit board on which SoC die 302 and PMIC die 220 are both mounted.

Figure 4A:
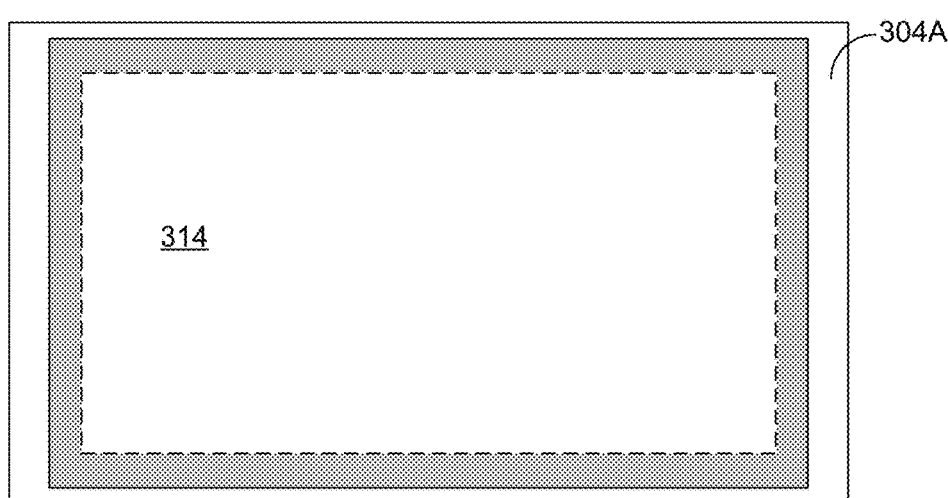
FIGS. 4A-4C are a top view and two bottom views of the integrated semiconductor device shown in FIG. 3A, in accordance with some embodiments.
Figure 4B:
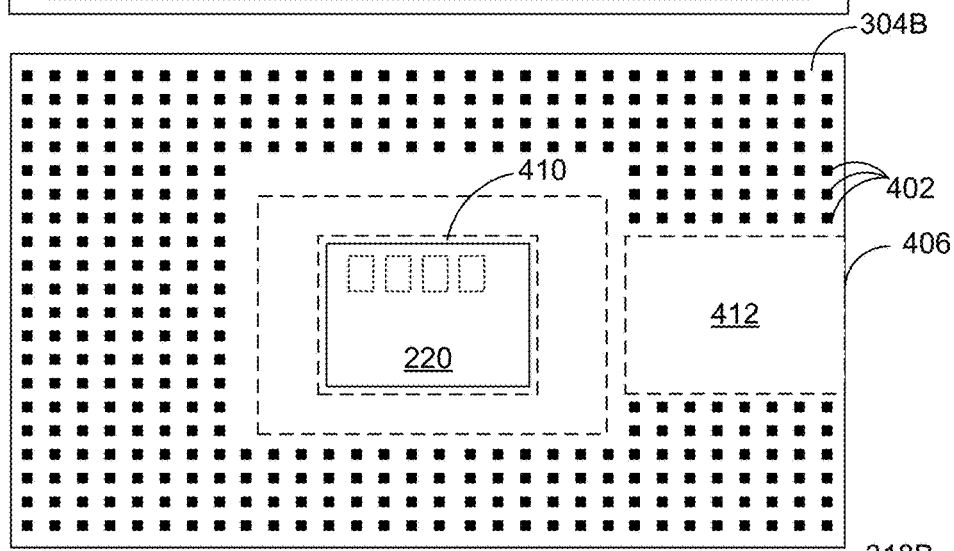
Figure 4C:
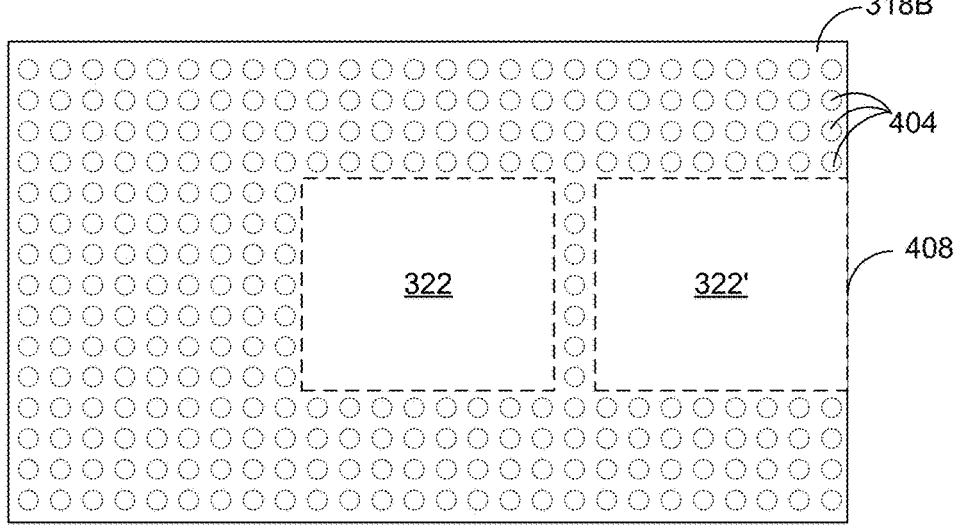

FIGS. 4A-4C are a top view 400 and two bottom views 440 and 480 of an integrated semiconductor device 300 shown in FIG. 3A in accordance with some embodiments.

Referring to FIG. 4A, in top view 400, cover 314 at least partially covers first surface 304A of package substrate 304. Part of first surface 304A of package substrate 304 may extend beyond cover 314. When cover 314 entirely covers first surface 304A, none of first surface 304A of package substrate 304 is seen in top view 400. Referring to FIG. 4B, in some embodiments, integrated semiconductor device 300 does not include socket substrate 318, and second surface 304B of package substrate 304 is partially exposed in bottom view 450 except that a first area of second surface 340B is covered by PMIC die 220. Connections 402 of package substrate 304 corresponding to the plurality of electrical connectors 320 are exposed on second surface 304B of package substrate 304 in bottom view 450. It is noted that the first area of second surface 340B is optionally a central area 410 of second surface 304B of package substrate 304 that is fully enclosed by package substrate 304 or alternatively an edge area 412 of second surface 304B of package substrate 304, which includes an edge 406 of package substrate 304.

Referring to FIG. 4C, in some embodiments, integrated semiconductor device 300 includes socket substrate 318, and second surface 304B of package substrate 304 is at least partially concealed by socket substrate 318. A fourth surface 318B of socket substrate 318 that opposes third surface 318A is exposed in bottom view 480. In some implementations, socket substrate 318 includes a recessed portion 322 that is formed on third surface 318A, and a depth of recessed portion 322 is less than a thickness of socket substrate 318. In bottom view 480, PMIC die 220 is concealed by socket substrate 318, while a plurality of socket contacts 404 is exposed on fourth surface 318B of socket substrate 318.

Alternatively, in some implementations, the depth of recessed portion 322 is equal to the thickness of socket substrate 318, and recessed portion 322 is an opening or cutoff 322' on socket substrate 318. In such embodiments, in bottom view 480, PMIC die 220 is exposed from opening 322 or cutoff 322' of socket substrate 318, and the plurality of socket contacts 404 is still exposed on fourth surface 318B of socket substrate 318.

In various embodiments of this application, PMIC die 220 is aligned with SoC die 302. In some embodiments, PMIC die 220 is coupled to a central area 410 of second surface 304B of package substrate 304 that is fully enclosed by edges of package substrate 304, and recessed portion 322 of socket substrate 318 is aligned with the central area 410 of second surface 304B and located at a central area of socket substrate 318. When the depth of recessed portion 322 is equal to the thickness of socket substrate 318, recessed portion 322 becomes an opening 322 on socket substrate 318. Alternatively, in some embodiments, PMIC die 220 is coupled to an edge area 412 of second surface 304B of package substrate 304, e.g., adjacent to an edge 406 of package substrate 304. In such embodiments, recessed portion 322 of socket substrate 318 is aligned with edge area 412 of second surface 304B, and is accessible from and open at an edge 408 of socket substrate 318. When the depth of recessed portion 322 is equal to the thickness of socket substrate 318, recessed portion 322 is a cutoff 322' on socket substrate 318.

Figure 5A:
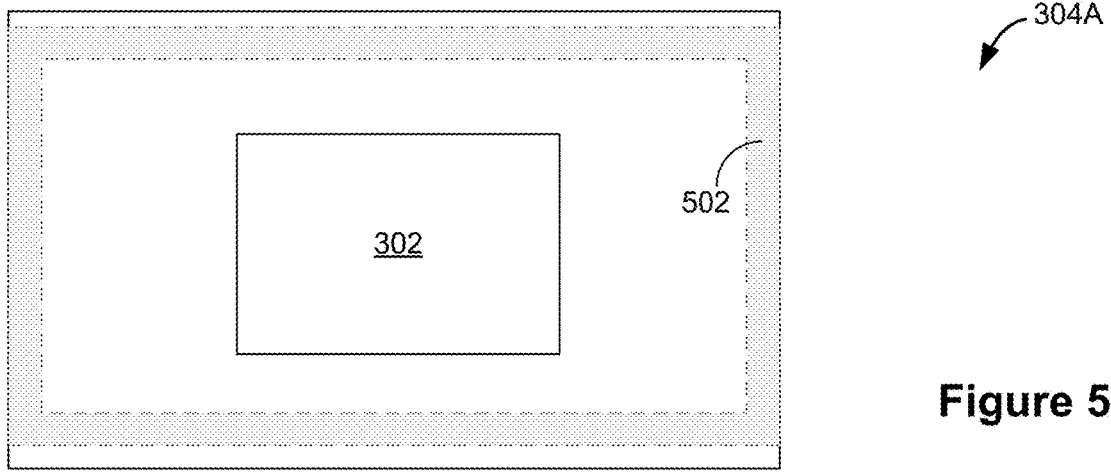
FIGS. 5A-5C illustrate a first surface of a package substrate, a second surface of the package substrate, and a third surface of a socket substrate of the integrated semiconductor device 300 shown in FIG. 3A, in accordance with some embodiments.
Figure 5B:
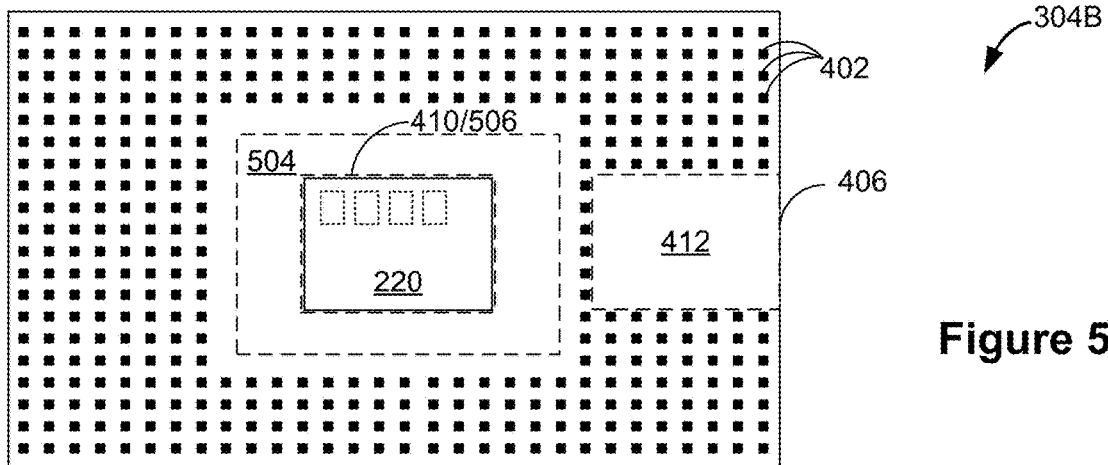
Figure 5C:
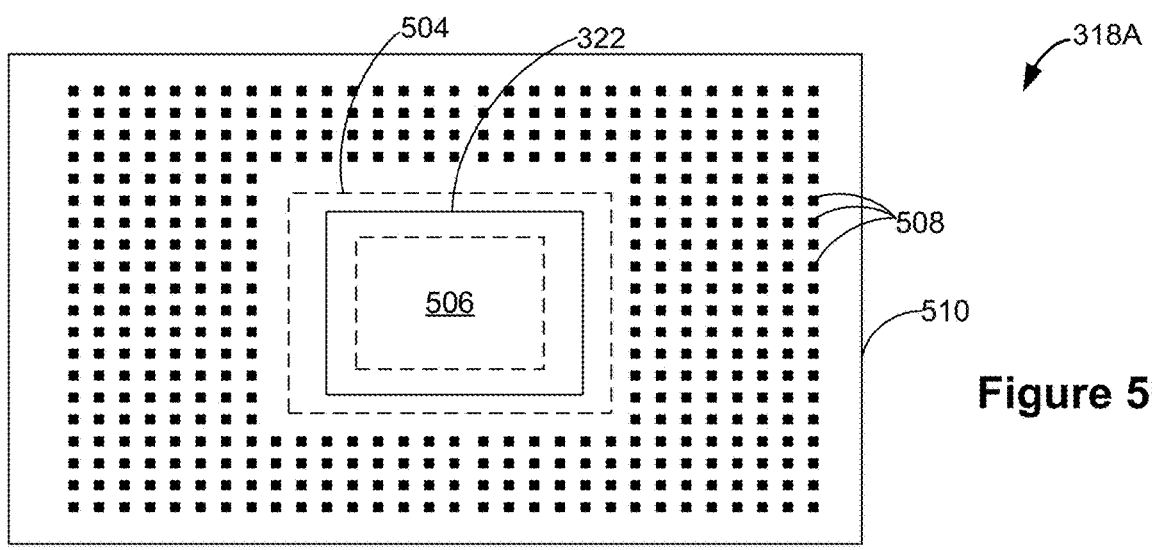

FIGS. 5A, 5B and 5C illustrate first surface 304A of package substrate 304, second surface 304B of package substrate 304, and third surface 318A of socket substrate 318 of integrated semiconductor device 300 shown in FIG. 3A in accordance with some embodiments, respectively. SoC die 302 is a flip-chip having a front surface facing and coupled to first surface 304A of package substrate 304. The front surface of SoC die 302 includes a plurality of signal inputs/outputs (I/Os) and a plurality of power connections 312. SoC die 302 also has a rear surface opposing the front surface and facing away from first surface 304A of package substrate 304. Referring to FIG. 5A, the front surface of SoC die 302 is concealed by a body of SoC die 302 with its signal I/Os and power connections 312, while the rear surface of SoC die 302 is exposed with part of first surface 304A surrounding SoC die 302.

Alternatively, in some embodiments not shown in FIG. 5A, SoC die 302 sits on top of first surface 304A of package substrate 304 with its front surface facing away from first surface 304A of package substrate 304. The signal inputs/outputs (I/Os) and power connections on the front surface of SoC die 302 are electrically coupled to connections formed on the part of first surface 304A surrounding SoC die 302 via ultrasonically-bonded conductive wires.

First surface 304A of package substrate 304 further includes an attachment area 502 to which a cover 314 is attached, e.g., using an adhesive. In some embodiments, the attachment area 502 includes or is adjacent to one or more edges of package substrate 304. In some embodiments, the attachment area 502 encloses SoC die 302 and part of first surface 304A of package substrate 304. In some embodiments, the attachment area 502 is kept away from at least one edge of package substrate 304.

Referring to FIG. 5B, second surface 304B of package substrate 304 is partially exposed. Second surface 304B of package substrate 304 includes a first area to which PMIC die 220 is mechanically coupled and a second area where the plurality of electrical connectors 320 are located. The first area of second surface 340B is covered by PMIC die 220. Connections 402 of package substrate 304 corresponding to the plurality of electrical connectors 320 are exposed on second surface 304B of package substrate 304. The first area of second surface 340B is optionally a central area 410 of second surface 304B of package substrate 304 that is fully enclosed by package substrate 304. Optionally, the first area of second surface 340B can include an edge 406 of package substrate 304, i.e., be located at an edge area 412 of second surface 304B of package substrate 304.

SoC die 302 has a first footprint 504 on package substrate 304, and PMIC die 220 has a second footprint 506 on package substrate 304 that overlaps the first area of second surface 340B. The first and second footprints 504 and 506 at least partially overlap. Connections 402 of package substrate 304 corresponding to the plurality of electrical connectors 320 are arranged on the second area of second surface 340B to avoid second footprint 506 of PMIC die 220. Further, in some embodiments, connections 402 of package substrate 304 are arranged on second surface 340B to avoid first footprint 504 as well.

Referring to FIG. 5C, third surface 318A of socket substrate 318 includes connections 508 corresponding to the plurality of electrical connectors 320. In some embodiments, the plurality of electrical connectors 320 is attached to connections 508 of third surface 318A and configured to receive connections 402 of package substrate 304. Third surface 318A of socket substrate 318 includes a third area corresponding to second footprint 506 of PMIC die 220 and a fourth area where connections 508 corresponding to the plurality of electrical connectors 320 are located. The third area of third surface 318A, corresponding to second footprint 506 of PMIC die 220, is optionally a central area of third surface 318A of socket substrate 318. In some embodiments not shown in FIG. 5C, the third area of third surface 318A can include an edge 510 of socket substrate 318, i.e., be located at an edge area of third surface 318A of socket substrate 318.

In some embodiments, the third area is recessed to form a recessed portion 322 to receive PMIC die 220 when PMIC die 220 is mechanically coupled to second surface 304B of package substrate 304. Optionally, the third area is partially recessed, so that a depth of recessed portion 322 is less than a thickness of socket substrate 318. Optionally, the third area is not recessed at all. Optionally, the third area is completely recessed to penetrate the entire thickness of socket substrate 318, in which case recessed portion 322 is an opening in the central area of third surface 318A of socket substrate 318 or a cutoff including an edge of socket substrate 318.

Figure 6:
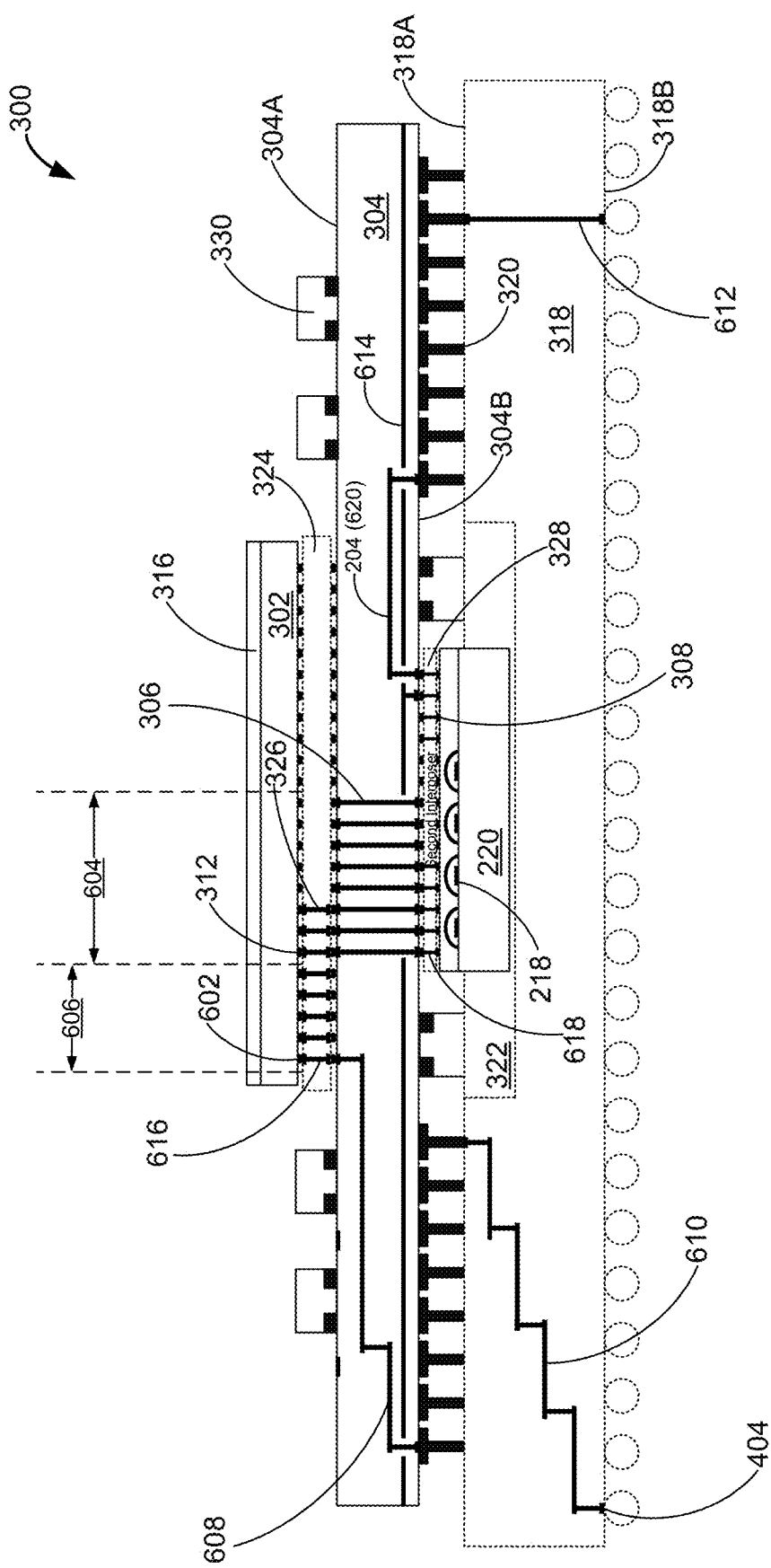
FIG. 6 is a cross sectional view showing electrical connections of an integrated semiconductor device, in accordance with some embodiments.

FIG. 6 is a cross sectional view showing electrical connections of an integrated semiconductor device 300 that provide power and exchange data for SoC die 302 in accordance with some embodiments. Cover 314 is not shown here. SoC die 302 is a flip-chip coupled onto first surface 304A of package substrate 304 and includes a plurality of signal inputs/outputs (I/Os) 602 and a plurality of power connections 312. In some embodiments, the plurality of power connections 312 is located on a first region 604 of SoC die 302 and aligned with a plurality of first via interconnects 306 of package substrate 304. In an example, first region 604 is a central portion that does not include any edge of SoC die 302. The plurality of power connections 312 is electrically coupled to the plurality of DC connections 308 of PMIC die 220 via the plurality of first via interconnects 306 and configured to receive DC power from PMIC die 220. Further, in some embodiments, the plurality of signal I/Os 602 is located on a second region 606 of SoC die 302 and electrically coupled to a plurality of first interconnect wires 608 of package substrate 304. Each of the plurality of first interconnect wires 608 is routed between two conductive contacts that are respectively located on first and second surfaces 304A and 304B of package substrate 304, and electrically coupled to a respective one of the plurality of electrical connectors 320 coupled between package substrate 304 and socket substrate 318.

In some embodiments, package substrate 304 is further coupled to socket substrate 318. Socket substrate 318 includes a fourth surface 318B opposing third surface 318A and a plurality of socket contacts 404 formed on fourth surface 318B, and each of the plurality of electrical connectors 320 is electrically coupled to a respective one of the plurality of socket contacts 404 by one of a second interconnect wire 610 or a through socket via 612.

It is noted that first region 604 and second region 606 of SoC die 302 are distinct and separated from each other. The plurality of power connections 312 are physically separated from the plurality of signal I/Os 602, when power connections 312 and signal I/Os 602 are coupled to socket substrate 318 and PMIC die 220, respectively. In an example, first region 604 is separated from second region 606 by at least a predefined distance, and power connections 312 are separated from signal I/Os 602 by at least the predefined distance. By these means, power connections 312 are protected from noise coupled from signal I/Os 602, thereby improving circuit performance of SoC die 302 (e.g., signal-to-noise ratios, data accuracy, and signal speed of SoC die 302).

In some embodiments, package substrate 304 includes a plurality of metal planes. One of the plurality of metal planes 614 is grounded. An interconnect wire 608 is optionally routed between first and second surfaces 304A and 304B of package substrate 304 via more than one of the plurality of metal planes of package substrate 304. Likewise, in some embodiments, socket substrate 318 includes a plurality of metal planes, one of which is optionally grounded. An interconnect wire 610 is optionally routed between third surface 318A and fourth surface 318B of socket substrate 318 via more than one of the plurality of metal planes of socket substrate 318.

In some embodiments, a first interposer 324 is disposed between SoC die 302 and first surface 304A of package substrate 304. First interposer 324 further includes a plurality of second via interconnects 616 configured to electrically couple power connections 312 and signal I/Os 602 of SoC die 302 to first via interconnects 306 and first interconnect wires 608 of package substrate 30, respectively. In some embodiments, a second interposer 328 is disposed between package substrate 304 and PMIC die 220. Thin film inductors 218 are located between second interposer 328 and PMIC die 220 and faces second surface 304B of package substrate 304. Second interposer 328 further includes a plurality of third via interconnects 618 configured to electrically couple first via interconnects 306 of package substrate 304 to DC connections 308 of PMIC die 220.

In some embodiments, PMIC die 220 is configured to receive an input DC supply 202 and output a plurality of internal supply voltages at the plurality of DC connections 308. PMIC die 220 is electrically coupled to a power source (e.g., an internal power filter of electronic device 100) that is not part of integrated semiconductor device 300. For example, PMIC die 220 is configured to receive the input DC supply 202 from the power source via one or more interconnect wires 620 of package substrate 304 and a subset of the plurality of electrical connectors 320. One or more interconnect wires 620 are either formed on second surface 304B of package substrate 304 or on a metal plane within package substrate 304. That said, each interconnect wire 620 is configured to connect two contacts on second surface 304B of package substrate 304.

FIG. 7A is a cross sectional view of a portion 700 of an integrated semiconductor device 300 including a plurality of power rails 702 and a plurality of output capacitors 216 in accordance with some embodiments, and FIG. 7B is a top view of PMIC die 220 that includes power rails 702 and output capacitors 216 in accordance with some embodiments. Integrated semiconductor device 300 includes a SoC die 302, a PMIC die 220 and a package substrate 304 that separates SoC die 302 and PMIC die 220. SoC die 302 is disposed on first surface 304A of package substrate 304, and PMIC die 220 is mechanically coupled to second surface 304B of package substrate 304. Optionally, a first interposer 324 is disposed between SoC die 302 and first surface 304A of package substrate 304. Optionally, a second interposer 328 is disposed between package substrate 304 and PMIC die 220. PMIC die 220 is electrically coupled to SoC die 302 to provide DC power across package substrate 304, first interposer 324 (if any) and second interposer 328 (if any) that separate PMIC die 220 and SoC die 302.

Referring to FIGS. 7A and 7B, power rails 702 are made of conductive metal, are formed on a substrate of PMIC die 220, and are used to deliver DC power from PMIC die 220 to SoC die 302. Power rails 702 are electrically coupled to both one or more internal supply voltages provided by DC-DC converters 210 and internal voltage supplies 206 of PMIC die 220 and by DC connections 308 formed on a top surface of PMIC die 220. As such, when first via interconnects 306 of package substrate 304 or third via interconnects 618 of second interposer 328 are aligned with and coupled to DC connections 308, the internal supply voltages are electrically passed across package substrate 304 or second interposer 328, respectively.

In an example, power rails 702 include a first plurality of power rails 702A and a second plurality of power rails 702B that are electrically coupled to a first internal voltage supply 206A and a ground (sometimes called circuit ground), respectively. First power rails 702A are physically separated from each other. Each first power rail 702 is electrically coupled to one or more respective DC connections 308 of PMIC die 220, providing the first internal voltage to respective first via interconnects 306 of package substrate 304, which then deliver the first internal voltage, produced by first internal voltage supply 206A, to respective power connections 312 of SoC die 302. Likewise, second power rails 702B are physically separated from each other, and each second power rail 702B is electrically coupled to one or more DC connections 308 of PMIC die 220, providing ground to first via interconnects 306 of package substrate 304, which deliver a corresponding ground voltage to respective ground power connections 312 of SoC die 302. As such, PMIC die 220 is configured to provide first internal voltage and ground to SoC die 302 via power rails 702 formed on the PMIC die 220, DC connections 308 of PMIC die 220 and first via interconnects 306 of package substrate 304.

Optionally, first power rails 702A and second power rails 702B are formed on a single metal layer. Optionally, first power rails 702A and second power rails 702B' are formed on two distinct metal layers. Optionally, first power rails 702A are parallel to each other. Optionally, second power rails 702B are parallel to each other and to first power rails 702A. Optionally, second power rails 702B' are parallel to each other, but not parallel to first power rails 702A (e.g., perpendicular to first power rails 702A).

Output capacitors 216 are electrically coupled to outputs of DC-DC converters 210 (not shown in FIGS. 7A, 7B) of PMIC die 220 to condition (e.g., filter) internal supply voltages provided by PMIC die 220. Optionally, each output capacitor 216 is manufactured on PMIC die 220, e.g., using one or more metal layers on a substrate of PMIC die 220. Optionally, output capacitors 216 include a discrete electronic component assembled onto the top surface of PMIC die 220 in a hybrid manner. In some embodiments, a respective output capacitor 216 (e.g., capacitor C4) overlaps with a subset of power rails 702. In some embodiments, one or more of the output capacitors 216 (C1-C3) do not overlap any power rail 702. In some embodiments, one of output capacitors 216 is electrically coupled to one of power rails 702. In some embodiments, one of output capacitors 216 is electrically coupled to DC connection 308 of PMIC die 220.

FIG. 7C is a cross sectional view of a portion 740 of another example integrated semiconductor device 300 including a plurality of power rails 702 and a plurality of output capacitors 216 in accordance with some embodiments, and FIG. 7D is a top view of SoC die 302 having power rails 702 and output capacitors 216 in accordance with some embodiments. SoC die 302 is a flip-chip coupled onto first surface 304A of package substrate 304. A top surface of SoC die 302 shown in FIG. 7B faces first surface 304A of package substrate 304 and is concealed. Power rails 702 are formed on a substrate of SoC die 302, are made of conductive metal, and are used to receive DC power provided by PMIC die 220. Power rails 702 are electrically coupled to power connections 312 formed on the top surface of SoC die 302 and internal circuit modules. As such, when first via interconnects 306 of package substrate 304 or second via interconnects 616 of first interposer 324 are aligned with and coupled to power connections 312, the internal voltage from PMIC die 220 are electrically delivered to SoC die 302 across package substrate 304 or second interposer 328, respectively.

In an example, power rails 702 of SoC die 302 include a first plurality of power rails 702A and a second plurality of power rails 702B that are electrically coupled to a first internal voltage supply 206A and ground, respectively. First power rails 702A are physically separated from each other. Each first power rail 702A is electrically coupled to a respective DC connection 308 of PMIC die 220, receiving the first internal voltage from respective first via interconnects 306 of package substrate 304. Likewise, second power rails 702B are physically separated from each other, and each second power rail 702B is electrically coupled to DC connections 308 of PMIC die 220, receiving ground voltage from respective first via interconnects 306 of package substrate 304.

In some embodiments, output capacitors 216 coupled to the outputs of DC-DC converters 210 of PMIC die 220 are formed or assembled on SoC die 302. Optionally, each output capacitor 216 is manufactured on SoC die 302. Optionally, each output capacitor 216 is assembled onto the top surface of SoC die 302 in a hybrid manner. In some embodiments, a respective output capacitor 216 (e.g., capacitor C4) overlaps with a subset of power rails 702. In some embodiments, one or more of the output capacitors 216 (e.g., capacitors C1-C3) do not overlap any power rail. In some embodiments, one or more of the output capacitors 216 are electrically coupled to one of power rails 702 and/or power connections 308.

Figure 7E:
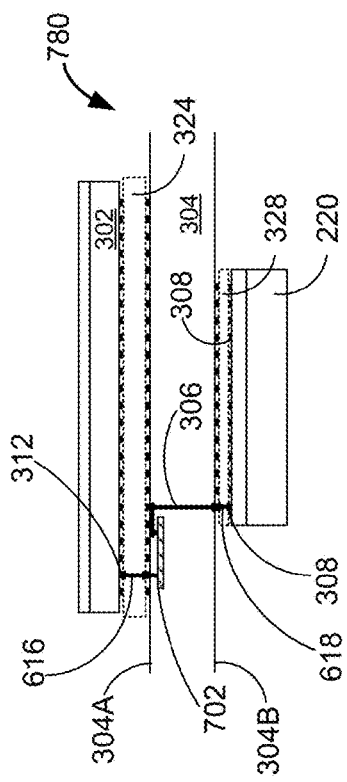
FIG. 7E is a cross sectional view of a portion of another example integrated semiconductor device including a plurality of power rails and a plurality of output capacitors, in accordance with some embodiments.
Figure 7F:
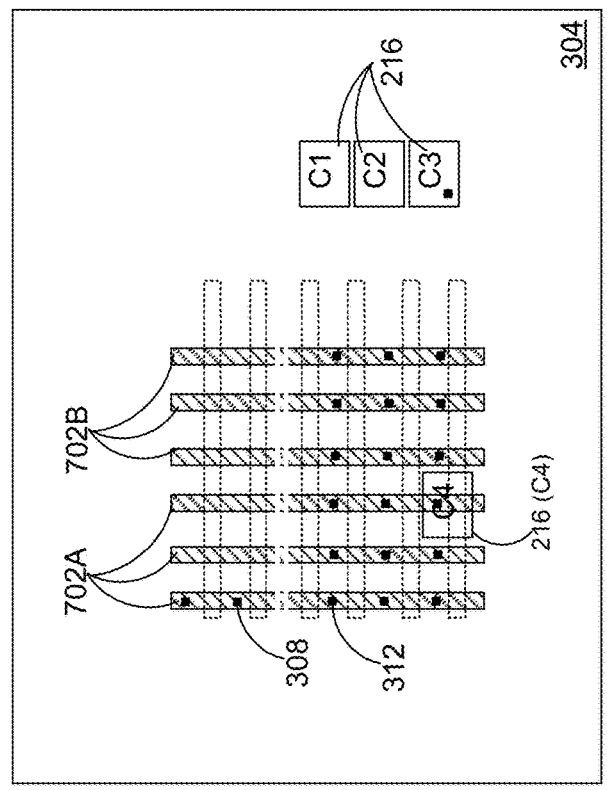
FIG. 7F illustrates a first surface of a corresponding package substrate having power rails and output capacitors, in accordance with some embodiments.

FIG. 7E is a cross sectional view of a portion 780 of another example integrated semiconductor device 300 including a plurality of power rails 702 and a plurality of output capacitors 216 in accordance with some embodiments, and FIG. 7F illustrates first surface 304A of package substrate 304 having power rails 702 and output capacitors 216 in accordance with some embodiments. Power rails 702 are formed on package substrate 304, are made of conductive metal, and are used to transfer DC power from PMIC die 220 to SoC die 302. Specifically, power rails 702 electrically couple power connections 312 formed on the top surface of SoC die 302 to first via interconnects 306, which lead to DC connections 308 of PMIC die 220.

In an example shown in FIG. 7E, power rails 702 formed on package substrate 304 include a first plurality of power rails 702A and a second plurality of power rails 702B that are electrically coupled to a first internal voltage supply 206A and the ground, respectively. First power rails 702A are physically separated from each other. Each first power rail 702A is electrically coupled to a respective DC connection 308 of PMIC die 220 via a respective first via interconnect 306 to receive the first internal voltage supply. Each first power rail 702A is also coupled to a respective power connection 312 of SoC die 302 to deliver the first internal voltage supply. Specifically, in some situations, a first power rail 702A is aligned with corresponding DC connection 308 and power connection 312, i.e., overlaps with footprints of DC connection 308 and power connection 312 at different locations along a length of the first power rail 702A. Likewise, second power rails 702B coupled to the ground are physically separated from each other, and at least a plurality of the second power rails 702B are electrically coupled to DC connections 308 of PMIC die 220 and power connections 312 of SoC die 302 to transfer ground therebetween.

In some embodiments, output capacitors 216 coupled to outputs of DC-DC converters 210 of PMIC die 220 are formed near or assembled on first surface 304A of package substrate 304. Optionally, a respective output capacitor 216 (e.g., capacitor C4) overlaps with a subset of power rails 702. Optionally, one or more of the output capacitors 216 (e.g., capacitors C1-C3) do not overlap any power rail. In some embodiments, one or more of the output capacitors 216 are electrically coupled to a respective output of DC-DC converter 210 of PMIC die 220 via one of power rails 702 and/or first via interconnects 306.

It is noted that power rails 702 may also be formed on package substrate 304 near second surface 304B of package substrate 304 or near both of first and second surfaces 304A and 304B of package substrate 304. Likewise, when integrated semiconductor device 300 includes first disposer 324, second disposer 326 or both, power rails 702 may be formed on the first and/or second disposers near a subset of the two planar surfaces of first disposer 324 and the two planar surfaces of second disposer 326. Additionally, first power rails 702A associated with a first internal voltage supply are optionally on the same substrate as second power rails 702B, or alternatively are on two or more different substrates. Power rails associated with two distinct internal voltage supplies are optionally formed on the same substrate or distinct substrates.

Output capacitors 216 coupled to outputs of DC-DC converters 210 of PMIC die 220 may be formed near or assembled on a subset of the two planar surfaces of first disposer 324 and the two planar surfaces of second disposer 326. When DC-DC converters 210 of PMIC die 202 are coupled to a plurality of output capacitors 216, they can be formed/assembled on the same substrate or multiple different substrates.

Figure 7G:
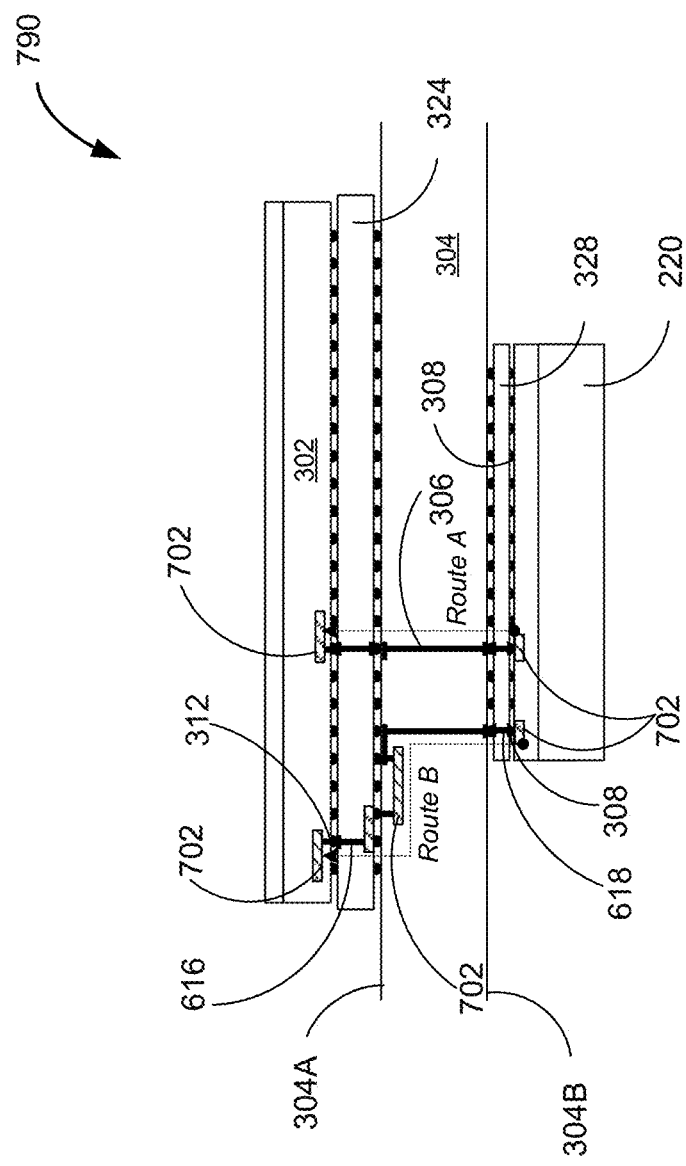
FIG. 7G a cross sectional view of a portion of another example integrated semiconductor device including a plurality of power rails, in accordance with some embodiments.

FIG. 7G a cross sectional view of a portion 790 of another example integrated semiconductor device 300 including a plurality of power rails 702 in accordance with some embodiments. In this example, power rails 702 are formed on more than one of SoC die 302, first interposer 324, package substrate 304, second interposer 328 and PMIC die 220. For example, in Route A, a respective DC connection 308 of PMIC die 220 is directly aligned with a respective power connection 312 of SoC die 302, and electrically connected with first, second and third via interconnects 616, 306 and 618 along a substantially straight path of Route A. In another example, in Route B, first interposer 324 and package substrate 304 have respective power rails 702 that are used to couple DC connection 308 of PMIC die 220 and power connection 312 of SoC die 302 in a non-straight path, in which at least some of the interconnects 616, 306 and 618 are not vertically aligned.

In some embodiments, both Route A and Route B are used to provide the same internal supply voltage to SoC die 220. Routes A and B end at two different power rails 702 on SoC die 220. Each route is independently controlled, e.g., electrically coupled to and decoupled from the same internal voltage supply 206. In some embodiments, routes A and B are configured to drive two distinct circuit blocks on SoC die 302 independently. Each one of the two distinct circuit blocks may be disconnected from the internal voltage supply 206 to conserve power without impacting operation of the other one of the two distinct circuit blocks. Also, Routes A and B are physically separated, thereby avoiding noise associated with the two distinct circuit blocks from coupling to each other on SoC die 302 via their power rails 702.

Referring to FIGS. 7A-7G, in some embodiments, power rails 702 are fully located within a second footprint 506 of PMIC die 220 (FIG. 7B), while in some embodiments, power rails 702 extend outside the footprint of PMIC die 220 but are fully located within a first footprint 504 of SoC die 302 (FIGS. 7D and 7F) when they are formed on package substrate 304, first interposer 324, second interposer 328 or SoC die 302. Due to spatial limitations with respect to power rails 702 and the various connections, when PMIC die 220 provides an internal voltage supply to SoC die 302, the internal voltage supply is transmitted along a path having a controlled length, including power rails 702 and via interconnects that pass through package substrate 304, first interposer 324 (if any) and second interposer 328 (if any). The controlled length is significantly shorter than a length of a conductive wire on a main logic board that connects PMIC and SoC dies mounted (e.g., side by side) on the same main logic board, thereby reducing unwanted parasitic resistance on a propagation path of the first internal voltage supply. Further, the use of multiple, parallel power rails 702 and coupling routes increases the equivalent width of the propagation path associated with the internal voltage supply, which reduces unwanted parasitic resistance in the propagation path. By these means, vertical arrangement of SoC die 302 and PMIC die 220 reduces at least a voltage drop of the internal voltage supply caused by the unwanted parasitic resistance when the internal voltage supply is transferred from PMIC die 220 to SoC die 302.

In some embodiments, PMIC die 220 includes a plurality of thin film inductors 218 optionally corresponding to the plurality of DC connections 308. The plurality of thin film inductors 218 is located adjacent to or facing second surface 304B of package substrate 304. For example, referring to FIG. 2, a DC-DC converter 210B includes one of thin film inductors 218 electrically coupled to DC connection 308 corresponding to internal voltage supply 206B.

Figure 8:
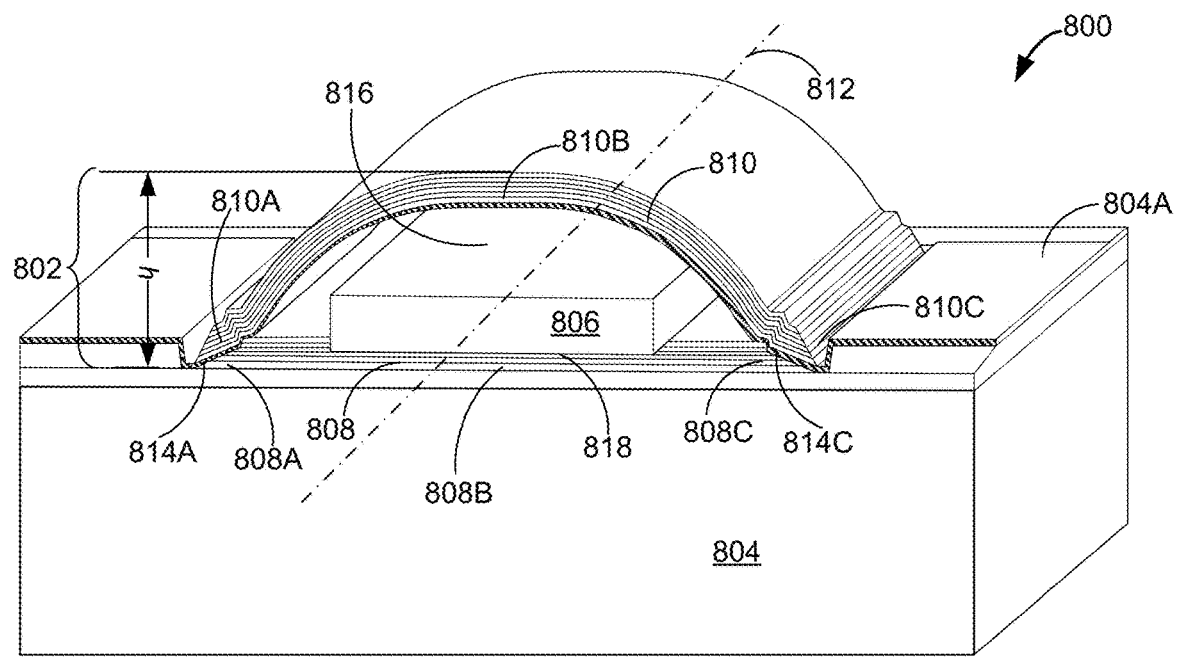
FIG. 8 is a perspective view of a semiconductor device, such as PMIC die, having a thin film inductor, in accordance with some embodiments.

FIG. 8 is a perspective view of a semiconductor device 800 (e.g., a PMIC die 220) having a thin film inductor 802 (e.g., inductors 218 in FIGS. 2 and 3A-3C) in accordance with some embodiments. Semiconductor device 800 includes a substrate 804 having a surface 804A and thin film inductor 802, which is formed on top of surface 804A of substrate 804. Thin film inductor 802 has a conductive wire 806, a first stack of magnetic layers 808 and a second stack of magnetic layers 810. Conductive wire 806 is disposed between the first and second stacks of magnetic layers 808 and 810 and extends along a longitudinal axis 812. Thin film inductor 802 is configured to provide a magnetic field in the first and second stacks of magnetic layers 808 and 810 in response to a current passing through conductive wire 806.

The first stack of magnetic layers 808 has a first edge portion 808A extending in parallel with longitudinal axis 812 of conductive wire 806, and first edge portion 808A has a first thickness that gradually decreases with distance from conductive wire 806. Specifically, the first thickness is measured on a cross section perpendicular to longitudinal axis 812; such as the cross section shown in FIG. 8. Optionally, the first stack of magnetic layers 808 includes a first plurality of magnetic layers. Further, the second stack of magnetic layers 810 has a second edge portion 810A that covers first edge portion 808A conformally and is separated from first edge portion 808A by an insulation layer 814. Insulation layer 814 has a thickness less than a separation threshold corresponding to a magnetic flux coupling criterion. Optionally, the second stack of magnetic layers 810 includes a second plurality of magnetic layers.

In some embodiments, semiconductor device 800 includes PMIC die 220 (FIG. 2) having a power management interface 208 and a DC-DC converter 210. An output of DC-DC converter 210 is coupled to an end of conductive wire 806. Specifically, in some embodiments, DC-DC converter 210 is formed on substrate 804 and includes an electrical contact electrically coupled to an internal or output node of converter 210. The electrical contact is exposed on surface 804A of substrate 804, and conductive wire 806 has two ends at least one of which is electrically coupled to the electrical contact of DC-DC converter 210.

In some embodiments (not shown in FIG. 8), conductive wire 806 includes a first conductive wire, and tin film inductor 802 further includes a second conductive wire disposed between the first and second stacks of magnetic layers 808 and 810 and oriented in parallel with the first conductive wire 806. Optionally, the first and second conductive wires are electrically coupled at a respective end of each of the first and second conductive wires. Optionally, the first and second conductive wires are electrically coupled at both ends of each of the first and second conductive wires.

In some embodiments, insulation layer 814 includes a first insulation layer 814A. The first stack of magnetic layers 808 has a first central portion 808B. First central portion 808B connects to first edge portion 808A and a third edge portion 808C opposing first edge portion 808A, and extends in parallel with longitudinal axis 812. Like first edge portion 808A, third edge portion 808C has the first thickness that gradually decreases with distance from conductive wire 806. The second stack of magnetic layers 810 has a second central portion 810B. Second central portion 810B connects to second edge portion 810A and a fourth edge portion 810C opposing second edge portion 810A, and extends in parallel with longitudinal axis 812. Fourth edge portion 810C covers third edge portion 808C conformally and is separated from third edge portion 808C by a second insulation layer 814C. Second insulation layer 814C has a thickness less than the threshold corresponding to the magnetic flux coupling criterion. Conductive wire 806 is disposed between first central portion 808B of the first stack of magnetic layers 808 and second central portion 810B of the second stack of magnetic layers 810.

In some embodiments, the first stack of magnetic material 808 is planar and formed on substrate 804, and has a first plurality of magnetic layers. Adjacent layers of the first plurality of magnetic layers are separated by a respective separation layer. Magnetic material in first stack 808 optionally includes an alloy with an atomic percentage composition, e.g., CoZrTa, CoZrTaB, FeCoB, and optionally includes a combination of two or more of these magnetic materials. A thickness of each magnetic material layer in first stack 808 is within a first preferred range between 100 nm to 500 nm. Each separation layer is optionally made of a dielectric material that can be silicon oxide ($SiO_2$), aluminum nitride ($Al_3N_4$), and/or alloy oxides (e.g., CoZrTaO, CoZrTaBO, FeCoBO). A thickness of each separation layer in first stack 808 is within a second preferred range between 10 nm and 50 nm. In an example, one of the first plurality of magnetic layers has a thickness of 200 nm, and an adjacent separation layer has a thickness of 30 nm.

Figures 9A, 9B:
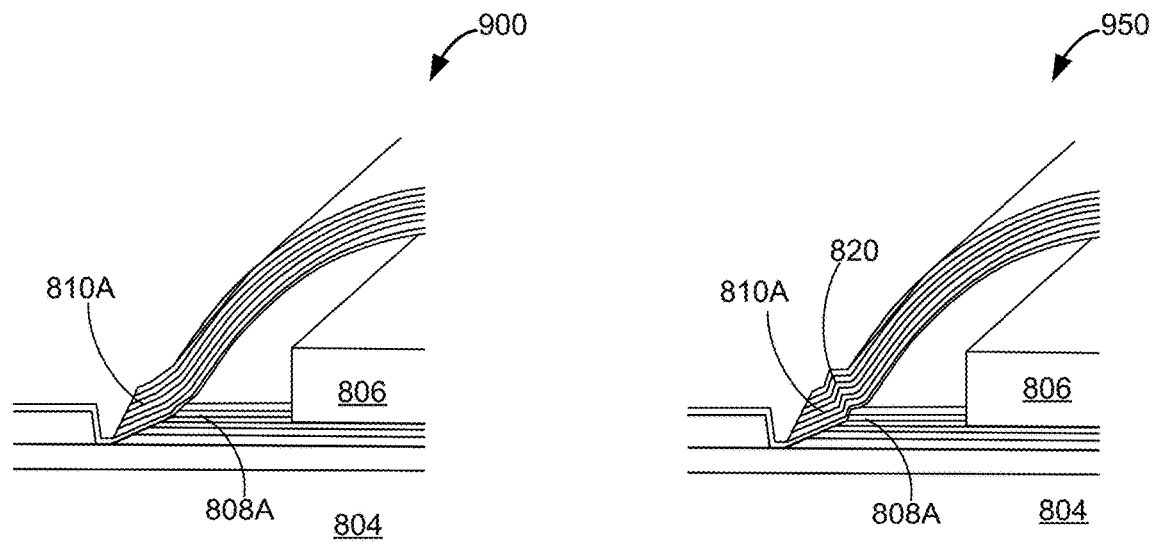
FIGS. 9A-9B are exploded views of edge portions of two thin film inductors, in accordance with some embodiments.

Further, the second stack of magnetic layers 810 includes a second plurality of magnetic layers. In some embodiments not shown in FIG. 8, each of the second plurality of magnetic layers has a substantially smooth curvature on a cross section that is perpendicular to longitudinal axis 812 (FIG. 9A). Alternatively, in some embodiments shown in FIG. 8, second edge portion 810A of the second stack of magnetic layers 810 includes a non-smooth portion 820 (FIG. 9B) having a dimension and a geometry that are configured to comply with the magnetic flux coupling criterion. Non-smooth portion 820 in second edge portion 810 has a discontinuous slope (i.e., a discontinuous tangent value), and is configured to increase magnetic flux and/or reduce edge current in second edge portion 810A. More details on second edge portion 810A are discussed with reference to FIGS. 9A and 9B.

In second stack 810, adjacent layers of the second plurality of magnetic layers are separated by a respective separation layer as well. Magnetic material in second stack 810 optionally includes an alloy with an atomic percentage composition, e.g., CoZrTa, CoZrTaB, FeCoB, and optionally includes a combination of two or more of these magnetic materials. A thickness of each magnetic material layer in second stack 810 is within the first preferred range between 100 nm to 500 nm. Each separation layer of second stack 810 is optionally made of a dielectric material that can be silicon oxide ($SiO_2$), aluminum nitride ($Al_3N4$), and/or alloy oxides (e.g., CoZrTaO, CoZrTaBO, FeCoBO). A thickness of each separation layer in second stack 810 is within the second preferred range between 10 nm and 50 nm. Magnetic materials in first stack 808 and second stack 810 can be substantially identical to or distinct from each other in their compositions and thicknesses. Likewise, separation layers in first stack 808 and second stack 810 can be substantially identical to or distinct from each other in their compositions and thicknesses.

In some embodiments, each magnetic layer in the first and second stacks of magnetic layers 808 and 810 is laminated, and has a respective magnetic layer thickness less than a thickness threshold. The first preferred range and this thickness threshold associated with each magnetic layer in first stack 808 and second stack 810 are determined based on a skin depth associated with the respective magnetic layer.

Further, each magnetic layer in the first and second stacks of magnetic layers is anisotropic and has a respective easy axis that is substantially parallel with longitudinal axis 812 of conductive wire 806. The respective easy axis corresponds to a crystallographic axis preferred by magnetic moments.

In some embodiments, the second stack of magnetic layers 810 is separated from conductive wire 806 by a polymeric material 816, and the insulation layer 814 separating second edge portion 810A of the second stack of magnetic layers 810 from first edge portion 808A of the first stack of magnetic layers 808 is a dielectric material. An example of polymeric material 816 is photoresist. In some embodiments, a length of conductive wire 806 that is covered by polymeric material 816 is greater than a length of the second stack of magnetic layers 810 measured along longitudinal axis 812.

In some embodiments, insulation layer 814 includes a first insulation layer. The first stack of magnetic layers 808 has a first central portion 808B connecting to first edge portion 808A. Conductive wire 806 is formed on top of first central portion 808B of the first stack of magnetic layers 808 and separated from first central portion 808B by a second insulation layer 818. In some embodiments, second insulation layer 818 has a thickness greater than that of first insulation layer 814.

It is noted that in accordance with the magnetic flux coupling criterion, the thickness of insulation layer 814 is so configured that a magnetic flux of thin film inductor 802 is greater than a threshold flux and edge currents in first edge portion 808A and second edge portion 810A are suppressed below a threshold edge current. In some embodiments, a saturation current of thin film inductor 802 is greater than a threshold current in accordance with the magnetic flux coupling criterion. As such, the gradually decreasing edge profile of the stacks of magnetic layers and the controlled thickness of insulation layer 814 enable high performance on-chip thin film inductors.

Additionally, in some embodiments, thin film inductor 802 has an inductor height h on a cross section, shown in FIG. 8, perpendicular to longitudinal axis 812. The inductor height h is less than a predefined profile height, e.g., 1.5 mm. A greater inductor height would increase mechanical stress in thin film inductor 802 and limit interconnect densities. Because the inductor height h of thin film inductor 802 is controlled within the predefined profile height, thin film inductor 802 can be integrated between SoC die 302 and PMIC die 220 while maintaining robustness and reliability of a corresponding integrated semiconductor device (e.g., device 300). That said, thin film inductor 802 makes vertical arrangement of SoC die 302 and PMIC die 220 feasible.

FIGS. 9A and 9B are exploded views of edge portions 900 and 950 of two thin film inductors in accordance with some embodiments, respectively. Referring to FIG. 9A, in some embodiments, each of the second plurality of magnetic layers has a substantially smooth curvature on a cross section that is perpendicular to longitudinal axis 812. A tangent value of the substantially smooth curve is continuous across each magnetic layer in second stack 810. Alternatively, referring to FIG. 9B, in some embodiments, second edge portion 810A of the second stack of magnetic layers 810 includes a non-smooth portion 820 having a dimension and a geometry that are configured to comply with the magnetic flux coupling criterion. Non-smooth portion 820 in second edge portion 810 has a discontinuous slope (e.g., a discontinuous tangent value), and is configured to increase magnetic flux and/or reduce edge current in second edge portion 810A.

Figure 10:
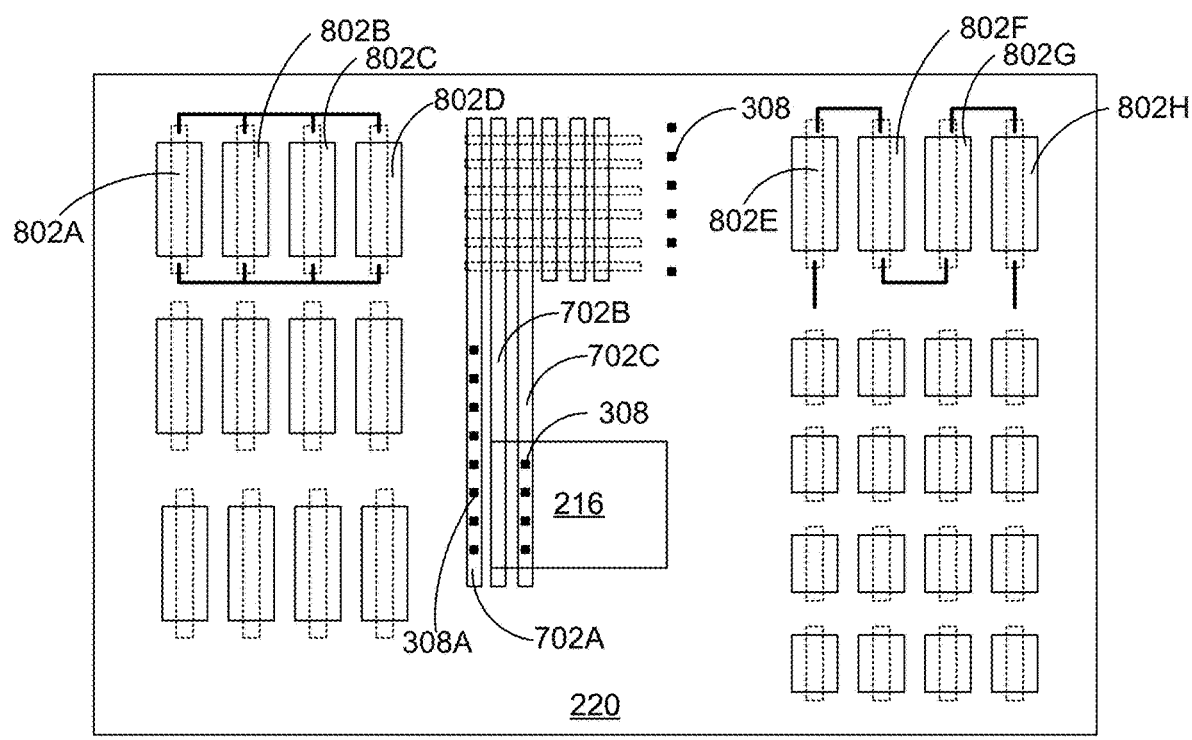
FIG. 10 illustrates a PMIC die having a plurality of thin film inductors, in accordance with some embodiments.

FIG. 10 illustrates a PMIC die 220 having a plurality of thin film inductors 802 in accordance with some embodiments. In some embodiments, a subset of the thin film inductors (e.g., thin film inductors 802A, 802B, 802C and 802D) are electrically coupled in parallel. In some embodiments, a subset of the thin film inductors (e.g., thin film inductors 802E, 802F, 802G and 802H) are electrically coupled in series. In some embodiments, surface 804A of substrate 804 further includes a plurality of DC connections 308 electrically coupled to SoC die 302 to provide DC power thereto. Optionally, a subset of DC connections 308A are coupled to a respective power rail 702A. In some embodiments, substrate 804 further includes an output capacitor 216. Output capacitor 216 is optionally formed below or offset from a set of power rails 702. When output capacitor 216 is formed below a power rail 702C, output capacitor 216 is optionally coupled to power rail 702C.

What is claimed is:

1. A semiconductor device, comprising:
   a substrate having a surface; and
   a thin film inductor formed on top of the surface of the substrate and having a conductive wire, a first stack of magnetic layers and a second stack of magnetic layers, wherein:
      the conductive wire is disposed between the first and second stacks of magnetic layers, and the thin film inductor is configured to provide a magnetic field in the first and second stacks of magnetic layers in response to a current passing through the conductive wire;
      the first stack of magnetic layers has a first edge portion extending in parallel with a longitudinal axis of the conductive wire, and the first edge portion has a first thickness that gradually decreases with distance from the conductive wire; and
      the second stack of magnetic layers has a second edge portion that covers the first edge portion conformally and is separated from the first edge portion by an insulation layer, the insulation layer having a thickness less than a separation threshold corresponding to a magnetic flux coupling criterion.

2. The semiconductor device of claim 1, wherein the conductive wire includes a first conductive wire, further comprising:
   a second conductive wire disposed between the first and second stacks of magnetic layers and oriented in parallel with the first conductive wire.

3. The semiconductor device of claim 1, wherein the insulation layer includes a first insulation layer; wherein:
   the first stack of magnetic layers has a first central portion connecting to the first edge portion and a third edge portion opposing the first edge portion and extending in parallel with the longitudinal axis, the third edge portion has the first thickness that gradually decreases with distance from the conductive wire;
   the second stack of magnetic layers has a second central portion connecting to the second edge portion and a fourth edge portion opposing the second edge portion and extending in parallel with the longitudinal axis;
   the fourth edge portion covers the third edge portion conformally and is separated from the third edge portion by a second insulation layer, the second insulation layer having a thickness less than the threshold corresponding to the magnetic flux coupling criterion; and
   the conductive wire is disposed between the first central portion of the first stack of magnetic layers and the second central portion of the second stack of magnetic layers.

4. The semiconductor device of claim 1, wherein the first stack of magnetic layers is planar and formed on the substrate, and has a first plurality of magnetic layers, and wherein adjacent layers of the first plurality of magnetic layers are separated by a respective separation layer.

5. The semiconductor device of claim 1, wherein the second stack of magnetic layers includes a second plurality of magnetic layers, and each of the second plurality of magnetic layers has a substantially smooth curvature on a cross section that is perpendicular to the longitudinal axis.

6. The semiconductor device of claim 1, wherein the second edge portion of the second stack of magnetic layers includes a non-smooth portion having a dimension and a geometry that are configured to comply with the magnetic flux coupling criterion.

7. The semiconductor device of claim 1, wherein the second stack of magnetic layers is separated from the conductive wire by a polymeric material, and the insulation layer separating the second edge portion of the second stack of magnetic layers from the first edge portion of the first stack of magnetic layers is a dielectric material.

8. The semiconductor device of claim 1, wherein each magnetic layer in the first and second stacks of magnetic layers is laminated, and has a respective magnetic layer thickness less than a thickness threshold that is determined based on a skin depth associated with the respective magnetic layer.

9. The semiconductor device of claim 1, wherein each magnetic layer in the first and second stacks of magnetic layers is anisotropic and has a respective easy axis that is substantially parallel with the longitudinal axis of the conductive wire.

10. The semiconductor device of claim 1, wherein in accordance with the magnetic flux coupling criterion, the thickness of the insulation layer is so configured that a magnetic flux of the thin film inductor is greater than a threshold flux and a saturation current of the thin film inductor is greater than a threshold current.

11. The semiconductor device of claim 1, further comprising:
a power control logic circuit and a DC-DC converter including the thin film inductor, wherein an output of the DC-DC converter is coupled to an end of the conductive wire.

12. The semiconductor device of claim 11, wherein the DC-DC converter is formed on the substrate and includes an electrical contact exposed on the surface of the substrate, and the conductive wire has two ends at least one of which is electrically coupled to the electrical contact of the DC-DC converter.

13. The semiconductor device of claim 1, wherein the thin film inductor has a cross section that is perpendicular to the longitudinal axis, and has an inductor height on cross section, and wherein the inductor height is less than a predefined profile height.

14. The semiconductor device of claim 1, wherein:
the insulation layer includes a first insulation layer,
the first stack of magnetic layers has a first central portion connecting to the first edge portion, and the conductive wire is formed on top of the first central portion of the first stack of magnetic layers and separated from the first central portion by a second insulation layer; and
the second insulation layer has a thickness greater than that of the first insulation layer.

15. An inductor, comprising:
a conductive wire, a first stack of magnetic layers and a second stack of magnetic layers, wherein:
the conductive wire is disposed between the first and second stacks of magnetic layers, and the inductor is configured to provide a magnetic field in the first and second stacks of magnetic layers in response to a current passing through the conductive wire;
the first stack of magnetic layers has a first edge portion extending in parallel with a longitudinal axis of the conductive wire, and the first edge portion has a first thickness that gradually decreases with distance from the conductive wire; and
the second stack of magnetic layers has a second edge portion that covers the first edge portion conformally and is separated from the first edge portion by an insulation layer, the insulation layer having a thickness less than a separation threshold corresponding to a magnetic flux coupling criterion.

16. The inductor of claim 15, wherein the conductive wire includes a first conductive wire, further comprising:
a second conductive wire disposed between the first and second stacks of magnetic layers and oriented in parallel with the first conductive wire.

17. The inductor of claim 15, wherein the insulation layer includes a first insulation layer; wherein:
the first stack of magnetic layers has a first central portion connecting to the first edge portion and a third edge portion opposing the first edge portion and extending in parallel with the longitudinal axis, the third edge portion has the first thickness that gradually decreases with distance from the conductive wire;
the second stack of magnetic layers has a second central portion connecting to the second edge portion and a fourth edge portion opposing the second edge portion and extending in parallel with the longitudinal axis;
the fourth edge portion covers the third edge portion conformally and is separated from the third edge portion by a second insulation layer, the second insulation layer having a thickness less than the threshold corresponding to the magnetic flux coupling criterion; and
the conductive wire is disposed between the first central portion of the first stack of magnetic layers and the second central portion of the second stack of magnetic layers.

18. The inductor of claim 15, wherein the first stack of magnetic layers is planar and has a first plurality of magnetic layers, and adjacent layers of the first plurality of magnetic layers are separated by a respective separation layer.

19. The inductor of claim 15, wherein the second stack of magnetic layers includes a second plurality of magnetic layers, and each of the second plurality of magnetic layers has a substantially smooth curvature on a cross section that is perpendicular to the longitudinal axis.

20. The inductor of claim 15, wherein the second edge portion of the second stack of magnetic layers includes a non-smooth portion having a dimension and a geometry that are configured to comply with the magnetic flux coupling criterion.

* * * * *